(12) United States Patent
Chapman

(10) Patent No.: US 6,267,167 B1
(45) Date of Patent: Jul. 31, 2001

(54) METHOD AND APPARATUS FOR APPLICATION OF ADHESIVE TAPE TO SEMICONDUCTOR DEVICES

(75) Inventor: Gregory M. Chapman, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/330,794

(22) Filed: Jun. 14, 1999

Related U.S. Application Data

(62) Division of application No. 08/908,291, filed on Aug. 7, 1997, now Pat. No. 6,096,165.

(51) Int. Cl.⁷ .................................................. B32B 31/00
(52) U.S. Cl. ..................... 156/433; 156/511; 156/517; 156/521
(58) Field of Search ..................... 156/433, 516, 156/517, 521, 511, 355; 438/111, 112, 118, 123

(56) References Cited

U.S. PATENT DOCUMENTS

| | | |
|---|---|---|
| 2,157,735 | 5/1939 | Brite . |
| 3,177,629 | 4/1965 | Anspach . |
| 3,308,000 | 3/1967 | Holman . |
| 3,332,818 | 7/1967 | MacLeod . |
| 3,436,294 | 4/1969 | Marano . |
| 3,536,550 | 10/1970 | Van Hofe . |
| 4,193,834 * | 3/1980 | Bernardi .............................. 156/519 |
| 4,317,695 | 3/1982 | Asar Madhu P. et al. . |
| 4,539,058 | 9/1985 | Burgess et al. . |
| 4,862,245 | 8/1989 | Pashby et al. . |
| 4,985,105 * | 1/1991 | Masuda ................. 156/261 |
| 5,286,679 | 2/1994 | Farnworth et al. . |
| 5,304,842 | 4/1994 | Farnworth et al. . |
| 5,635,009 * | 6/1997 | Kawamura et al. ................. 156/261 |
| 6,025,212 * | 2/2000 | VanNortwick et al. ............. 438/111 |
| 6,099,678 * | 8/2000 | Kotato et al. ........................ 156/256 |

\* cited by examiner

Primary Examiner—Michael W. Ball
Assistant Examiner—John T. Haran
(74) Attorney, Agent, or Firm—TraskBritt

(57) ABSTRACT

A first adhesively coated tape material length is supplied to a first die associated with a cutting and application mechanism. A second length of adhesively coated tape material is also provided to a second die of the cutting and application mechanism. A plurality of LOC leadframes is supplied sequentially through the application structure to apply a first decal cut from the first tape material to a first die site at a first location and to apply a second decal cut from the second tape material to a second die site at a second location.

48 Claims, 13 Drawing Sheets

METHOD AND APPARATUS FOR APPLICATION OF ADHESIVE TAPE TO SEMICONDUCTOR DEVICES

CROSS REFERENCE TO RELATED APPLICATION

This application is a divisional of application Ser. No. 08/908,291, filed Aug. 7, 1997, now U.S. Pat. No. 6,096,165.

BACKGROUND OF THE INVENTION

1. Field of the Invention

This invention pertains to semiconductor devices and, more particularly, to a method and apparatus for applying adhesively coated tape material segments, i.e., decals, to leadframes for semiconductor devices, particularly including "Lead-Over-Chip" type semiconductor device assemblies.

2. State of the Art

In semiconductor manufacture, a single semiconductor die (or chip) typically has a lower surface, the back of the die, being devoid of circuitry located thereon. Each semiconductor die also has an opposite upper surface, the active surface or face of the die, having integrated circuitry constructed thereon which is electrically accessible via wire bonding pads located thereon. The wire bonding pads may be arranged in a variety of configurations on the active surface of the semiconductor device, such as along the center of the die, the edges of the die, both, etc.

Typically, a leadframe is used to connect the wire bonding pads of the semiconductor device via wire bonds to other electronic circuitry.

A conventional leadframe and semiconductor device assembly or packaging process employs an adhesive layer to attach the semiconductor device to the die paddle of the leadframe while the lead fingers of the leadframe extend to and terminate adjacent the peripheral edges of the semiconductor device. Typically, the adhesive used to attach the semiconductor device to the die paddle is an epoxy acrylic silicone of polyamide material.

Alternately, a lead-over chip, also sometimes referred to as a lead-on-chip (LOC) leadframe, is used to provide lead fingers to be electrically connected to the bond pads of the semiconductor device through wire bonds thereto and to support the semiconductor device by being adhesively secured to the active surface thereof and, subsequently, encapsulated. A LOC type semiconductor package is described in U.S. Pat. No. 4,862,245 (Pashby et al.).

Typically, in an LOC semiconductor device assembly, the active surface of the semiconductor device is adhesively attached to the underside of the lead fingers of the leadframe through the use of a double-sided, adhesively coated tape having a thermosetting adhesive thereon, although a thermoplastic adhesive may also be used if desired. That is, the adhesively coated tape has thermosetting adhesive coated on both sides thereof and is attached to the underside of the leadframe fingers and the active surface of the semiconductor device using heat and pressure. If necessary, an oven may then be used to further cure the adhesive. After the adhesive is cured, securing the lead fingers in position on the active surface of the semiconductor device, the leadframe is transferred to a wire bonding machine where the bond wires are connected to the bond pads on the active surface of the semiconductor device and to the lead fingers of the leadframe.

Prior to attaching the semiconductor device to the leadframe using a LOC configuration, the adhesively coated tape must be placed onto a heated leadframe that will secure the semiconductor device to the leadframe but will allow access to the bond pads of the semiconductor device. Typically, a single piece of LOC tape is distanced from a continuous roll of tape and cut, using a punch, into two tape segments, i.e., decals, that are spaced apart and cut away to provide access to the bond pads of the semiconductor device. In such a LOC configuration, the continuous strip of leadframes to which the adhesively coated tape is to be applied at die sites thereon is moved perpendicularly to the direction of feeding of the continuous roll of tape from which the tape is cut and applied to the die sites of the leadframe. In such an instance, a single punch is typically used to cut the tape from the continuous roll of tape and apply the cut tape to the die site of an individual leadframe in a one-punch operation where the tape is fed orthogonally with respect to the feeding and movement of the leadframes. The leads of the die site of the leadframe to which tape is applied by the punch are, in turn, positioned such that the tape segments are located adjacent each other on the leads of the leadframe at the die site, such leads extending orthogonally on the leadframe with respect to the movement of the leadframe through the punch assembly.

Such a process suffers from the problem that LOC tape is an expensive material and a large amount of tape is wasted during formation of the LOC tape pieces. With a conventional LOC tape punching apparatus as described hereinbefore, the width of the tape must be large enough to punch two pieces of tape with a space therebetween for the bond pads of the semiconductor device. Therefore, typically, the pieces of tape are cut from the center of a continuous length of tape having a width that is larger than required for the individual pieces of tape. Additionally, the tape cut out for the area where the bond pads of the semiconductor device are located is also waste. In some prior art systems, as much as seventy-five percent (75%) of the tape may be wasted in the cutting and application of pieces of tape to a leadframe, such as a LOC leadframe.

Since adhesive tape used for the LOC type semiconductor device assembly, or any leadframe design which requires the use of tape thereon, is relatively expensive and the misapplication of the tape during the manufacturing process can produce problems in the subsequent automated manufacturing processes, in turn, imposing increased costs, a method for efficiently applying adhesive tape where desired on a leadframe is desirable. Particularly, it is desirable to have tape applied to a leadframe without wasting tape and without having to apply the tape in a single punch operation to the desired die site of the leadframe.

SUMMARY OF THE INVENTION

A system and method for applying adhesively coated tape material to the die sites of semiconductor leadframes where the die site of the leadframe is indexed to separate locations for the application of each tape segment, i.e., decal. The system and method are used to apply tape segments to leadframes having leads to which the tape segments are applied which are, in turn, parallel to the direction of movement of the leadframe through the tape die assembly, although, if desired, the leads on the leadframe may extend orthogonally with respect to the direction of movement of the leadframe and the tape segments to be applied thereto.

A system for applying adhesively coated tape material to the die sites of semiconductor leadframes includes a first source for supplying a first length of adhesively coated tape material to a first location of a die site of the leadframe and a second source for supplying a second length of adhesively coated tape material to a second location at the die site of the leadframe after the indexing of the die site of the leadframe to another location for the application of tape thereto. Indexing means are also provided to supply and index for the application of tape to a die site of a plurality of leadframes for semiconductor devices in die site by die site of a leadframe-by-leadframe sequence. An "application means" is configured to receive the plurality of leadframes for semiconductor devices in a die site by die site of a leadframe-by-leadframe sequence and to receive the first length and the second length of adhesively coated tape materials, supplied in strip form. The application means has cutting means for independently cutting a first increment from the first length of adhesively coated tape material and applying the first increment to a first portion of a die site of a leadframe of the plurality of leadframes, supplied in strip form. The cutting means of the application means also independently cuts a second increment of the second length of adhesively coated tape material and applies the second increment to a second portion of the die site of a leadframe of the plurality of leadframes. Control means are interconnected to the application means, to the indexing means, to the first source and to the second source, all supplying operation signals to the control means.

The operation signals operate the indexing means to supply a plurality of leadframes for semiconductor devices in leadframe-by-leadframe sequence to the application means and to position the first portion of the die site and the second portion of the die site to receive the first increment and the second increment of adhesively coated tape material, respectively. The operation signals are also supplied to operate the first source to cause the first length of adhesively coated tape material to be selectively supplied to the application means when or as the first site is positioned to receive the first increment at the first portion thereof. The operation signals are also provided to operate the second source to cause the second length of adhesively coated tape material to be supplied to the application means when or as the second portion of the first die site is positioned to receive the second increment. The control means also supplies operation signals to operate the cutting means of the application means to selectively cut and apply the first increment to the first portion of the die site of a leadframe of the plurality of leadframes and to cut and apply the second increment to the second portion of the die site of a leadframe of the plurality of leadframes.

In the preferred arrangement, the cutting means includes a first die movable relative to a first cutting structure configured to receive the first length of the adhesively coated tape material. The cutting means also includes operation means positioned to independently move the first die relative to the first cutting structure to form the first increment and to urge the first increment toward and against the first portion of the die site of a leadframe of a plurality of leadframes. The cutting means also preferably includes a second die independently movable relative to the second cutting structure configured to receive the second length of adhesively coated tape material. The operation means is preferably positioned to move the second die relative to the second cutting structure to form the second increment and to urge the second increment toward and against the second portion of the die site of a leadframe of the plurality of leadframes.

Desirably, the first source includes a first adhesively coated tape supply configured to supply the first length and first driving means positioned to receive the first length and to urge the first length towards the first cutting structure. The first driving means is connected to the control means to receive operation signals to urge the first length toward the first cutting structure only when a first portion of the die site of a leadframe of the plurality of leadframes is positioned or is to be positioned relative to the first portion of the die site to receive the first increment.

The second source preferably includes a second adhesively coated tape supply configured to supply the second length and second driving means positioned to receive the second length. Second driving means also operates to urge the second length toward the second cutting structure. The second driving means is connected to the control means to receive operation signals to urge the second length toward the second cutting structure only when a second portion of the die site of a leadframe of said plurality of leadframes is positioned or is to be positioned relative to the second die to receive the second increment.

Preferably, the first driving means is a first stepping motor connected to a first drive roller over which the first length of adhesively coated tape material is positioned. The first driving means may also include a first driven roller positioned proximate the first drive roller with the first length of adhesively coated tape material positioned between the first drive roller and the first driven roller. Similarly and desirably, the second driving means includes a second stepping motor connected to a second drive roller with a second driven roller positioned proximate the second drive roller. The second length of adhesively coated tape material is positioned between the second driven roller and the second drive roller.

In preferred configurations, the first driving means and the second driving means both include guide structure to guide the first length between the supply of adhesively coated tape material and the first cutting structure.

The indexing means preferably includes structure configured to urge the plurality of leadframes in strip form for semiconductor devices in leadframe-by-leadframe sequence relative to the application means. The plurality of leadframes is connected one to the other in a continuous strip form. The indexing means preferably includes a movable member which engages at least one indexing hole of at least one rail of the leadframe strip to move the leadframe the desired distance for the application of the adhesively coated tape material. The indexing means alternately includes a roller with a motor connected to drive the roller. The motor is connected to the control means to receive operation signals therefrom to cause the motor to move the plurality of leadframes relative to the application means in the leadframe-by-leadframe sequence. The plurality of leadframes preferably is formed in a continuous strip form having removable carrier rails or edges thereon having, in turn, drive perforations formed therein. The roller desirably includes a plurality of teeth positioned to drivingly engage a portion of the drive perforations to thereby connect to and drive the plurality of leadframes.

The operation means of the cutting means preferably includes a first die moving mechanism. The first die moving mechanism may be a solenoid mechanism positioned to urge the first die frame to move. The solenoid is connected to receive operation signals from the control means to cause the first die moving mechanism to move the first die toward a leadframe of a plurality of leadframes.

The application means preferably includes a block positioned opposite the first die with a leadframe of the plurality of leadframes positioned between the block and the first die. The block inhibits movement of the leadframe of the plurality of leadframes upon movement of the first die against the leadframe of a plurality of leadframes. The block is preferably sized for positioning opposite both the first die and the second die with a leadframe of the plurality of leadframes positioned between the block and the first die and with a leadframe of the plurality of leadframes positioned between the block and the second die. The block desirably includes heat means to heat the block and, in turn, the leadframe, the first increment and the second increment upon urging of the first increment and the second increment against a leadframe of the plurality of leadframes.

The application means also may include guide structure for guiding the first length of adhesively coated tape material and guide structure for guiding the second length of adhesively coated tape material. The first cutting structure and the second cutting structure may be unitarily formed into a single structure. The operation means may be desirably configured to urge the first die and the second die together. Alternately, the operation means may be configured to urge the first die and the second die to move independent of each other.

In a desired alternate arrangement, the plurality of leadframes includes a first leadframe, a middle leadframe and a last leadframe. The indexing means is operable to urge the first leadframe to a first position with its first site positioned relative to the first die to receive the first increment upon activation of the first source with the second site positioned spaced to not be contacted by the second die. Control means is configured to send operation signals to activate the first source to supply the first length of adhesively coated tape material to the first cutting means and to send operation signals to not activate the second source.

Desirably, the indexing means is also operable to urge the middle leadframe to have its first site positioned relative to the first die to receive the first increment upon activation of the first source and the first die to thereafter urge the middle leadframe to have its second site positioned relative to the second die to receive the second increment upon activation of the second source and the second die. The control means preferably sends operation signals to activate the first source to supply the first length of adhesively coated tape material to the first cutting means and to activate the second source to supply the second length of adhesively coated tape material to the second cutting means.

Most desirably, the indexing means is operable to urge the last leadframe to be positioned with its second site positioned relative to the second die to receive the second increment upon activation of the second source and the second die. The first site is positioned to not be contacted by the first die. The operation means desirably sends operation signals (e.g., no signals) to activate the second source to supply the second length to the second cutting means and to not activate the first source. Preferably, the indexing means urges the first leadframe and the middle leadframe and the last leadframe to move continuously in sequence while simultaneously causing the first source and the second source to operate to supply the respective first length and the second length to the first cutting means and the second cutting means.

In an alternate arrangement, a system to apply adhesively coated tape to a LOC leadframe of a plurality of LOC leadframes includes a base and a block positioned opposite the base and spaced therefrom for a LOC leadframe to pass closely and freely therebetween. Supply means is positioned relative to the base to supply the first adhesively coated tape length and the second adhesively coated tape length. Indexing means are provided to move each LOC leadframe of the plurality of leadframes relative to the base. Application means is mechanically associated with the base for cutting the first tape length into a first tape decal and applying the first tape decal to a first position at a die site of the LOC leadframe. The application means also cuts the second tape length into a second tape decal and applies the second decal to a second position of the die site of the LOC leadframe. Control means are interconnected to the supply means, to the application means and to the indexing means to supply control signals so that decals are applied to the first position of a die site on an LOC leadframe and so that decals are applied to the second position of a die site on an LOC leadframe.

A method of attaching decals includes providing the first source, the second source, indexing means and application means. The method includes operating the first source to supply a length of first adhesively coated tape to the application means. The second source is also operated to supply a length of adhesively coated tape to the application means. The application means operates to cut the first decal from the first length of the first adhesively coated tape and applies the first decal to the first position of a die site of each LOC leadframe.

The application means includes a first die for cutting the first decal and a second die for cutting the second decal. The indexing means operates to advance the first LOC leadframe of the plurality of leadframes to position its first site to receive the first decal, to index the first leadframe to position its second position of a die site to receive the second decal, and to concurrently index a second LOC leadframe of the plurality of LOC leadframes to position the first site of the second LOC leadframne on the plurality of LOC leadframes to receive another first decal at the same time the first LOC leadframe is to receive the second decal.

DETAILED DESCRIPTION OF THE INVENTION

Figure 1:
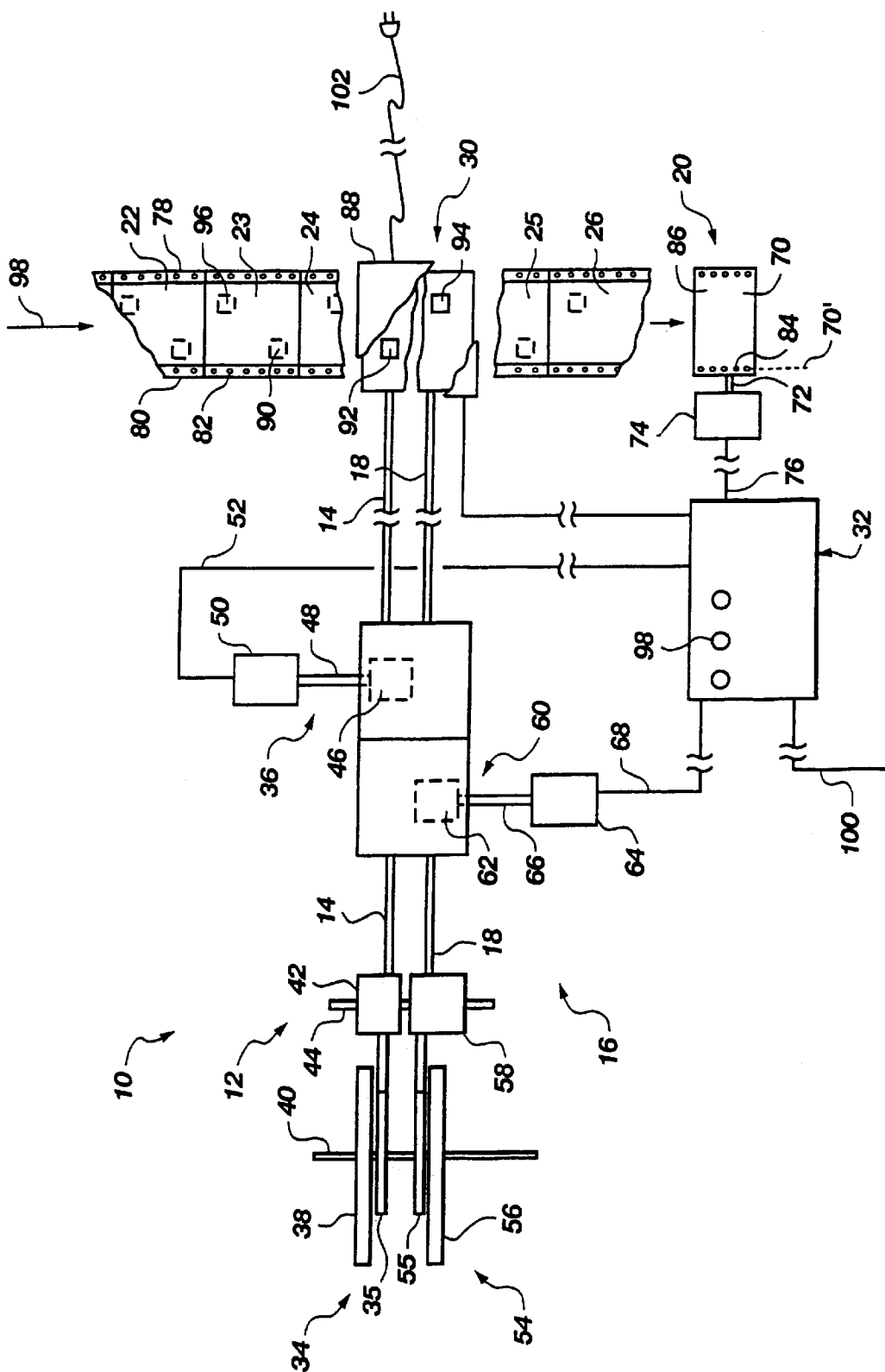
FIG. 1 is a simplified depiction of a system of the present invention.

Referring to drawing FIG. 1, a system 10 is illustrated for applying a plurality of decals or adhesive tape increments to portions of a die site of each leadframe of a plurality of leadframes for use with semiconductor devices moving the leadframe in leadframe-by-leadframe sequence through application structure to individually apply each adhesive tape increment to a portion of each die site of each leadframe at a separate indexed location of the die site of the leadframe.

More specifically, the system 10 of FIG. 1 includes a first source 12 for supplying a first length 14 of adhesive material. The system 10 also includes a second source 16 for supplying a second length 18 of adhesive material. The system 10 also has indexing means which here includes indexing structure 20. The die sites of a plurality of leadframes 22–26 is positioned to be moved relative to application structure 30 by the indexing structure 20. The application structure 30 is configured to receive the plurality of leadframes 22–26 of semiconductor devices as well as to receive the first length 14 of adhesive material and the second length 18 of adhesive material. As will be discussed hereinafter, the application means includes cutting means for cutting a first increment from the first length 14 of adhesive material and applying the first increment to a first portion of a die site (e.g., site 90) of an individual leadframe of the plurality of leadframes 22–26 and for cutting a second increment from the second length 18 of adhesive material and applying the second increment to a second portion of the die site (e.g., site 96) of an individual leadframe of the plurality of leadframes 22–26 at a second location thereof.

Control means is also provided to provide control signals or operation signals to operate the system. The control means here shown includes a controller 32 interconnected to operate the indexing means and, more particularly, the indexing structure 20. It is also interconnected to the first source 12 and to the second source 16 to respectively supply the first length 14 and the second length 18 to the application means and, more particularly, the application structure 30. The controller 32 supplies operation signals to operate the cutting means of the application means to selectively cut and supply the first increment of the first length 14 to the first portion of a die site of a leadframe of the plurality of leadframes 22–26 and to selectively cut and apply the second increment from the second length 18 to the second portion of a die site of a leadframe of the plurality of leadframes 22–26.

The first source 12 illustrated in drawing FIG. 1 includes a first adhesive supply 34 configured to supply the first length 14. The first source 12 also includes a first driving means such as first drive structure 36 configured to receive the first length 14 and to urge the first length 14 toward the application structure 30 and more specifically the first cutting structure of the application structure 30. The first adhesive supply 34 includes a roll of adhesively coated tape material 35 wound on or associated with reel 38. The reel 38 is rotatably mounted to rotate with or about axle 40. The axle 40 is either fixedly or rotatably mounted to other supporting structure not here shown. The adhesively coated tape material 35 is shown passing through, over or about a first guide 42 which is fixedly or rotatably mounted about a second axle 44. The second axle 44 is either fixedly or rotatably mounted to other support structure not here illustrated. The first guide 42 is positioned to align the first length 14 to the first drive structure 36.

The first drive structure 36 here shown includes a drive roller 46 interconnected to be driven by a first drive shaft 48 and a first stepping motor 50. The stepping motor 50 is interconnected by a conductor 52 to receive operating signals from the controller 32. That is, electrical signals are supplied via conductor 52 to activate the stepping motor 50 to, in turn, drive the roller 46 and the first length 14 toward the application structure 30.

As also seen in drawing FIG. 1, the second source 16 includes a second supply of adhesively coated tape material 54 associated with a reel 56 on axle 40. The second adhesive supply 54 includes a circular roll of adhesively coated tape material 55 that passes through, over or about a second guide 58 which is also rotatably or fixedly mounted about the axle 44. The second length 18 proceeds from the second adhesive supply 54 to the second drive structure 60.

As here shown, the second drive structure 60 includes second drive roller 62 which is driven by a second stepping motor 64 via a second drive shaft 66. The second stepping motor 64 is interconnected by conductor 68 to receive electrical drive signals from the controller 32. That is, upon receipt of an electrical signal, the stepping motor 64 rotates, in turn, causing the drive shaft 66 and the second drive roller 62 to rotate to urge the second length 18 toward the application structure 30 and, more particularly, the second cutting structure a preselected distance which preferably is the length of the increment or decal.

Also depicted in drawing FIG. 1, the indexing structure 20 includes a movable arm 70' (shown in dashed lines) which engages an indexing hole 82 in the rail or edge 80 to move the strip of leadframes a desired amount or distance. The movable arm 70' may be actuated in any convenient manner using any suitable power source and central arrangement. Alternately, the indexing structure 20 includes an indexing roller 70 interconnected by a shaft 72 to a drive motor 74. The drive motor 74 is interconnected by conductor 76 to receive operation signals from the controller 32. The operation signals cause the motor 74 to rotate which, in turn, causes the indexing roller 70 to rotate. The plurality of leadframes for semiconductor devices is positioned to be driven by the indexing roller 70 to, in turn, cause the plurality of leadframes 22–26 to move relative to the application structure 30. It may be particularly noted that the plurality of leadframes 22–26 of semiconductor frames is formed to have a removable carrier rail or edge 78 and 80 on each side. Each removable edge or rail 78 and 80 has a plurality of perforations positioned to interact with a plurality of teeth 84 and 86 in or on the indexing roller. That is, the teeth 84 and 86 are positioned to drivingly engage the perforations 82 to facilitate movement of the plurality of leadframes 22–26 relative to the application structure 30. Upon completion of certain steps in the manufacturing process, the removable carrier rails or edges 78 and 80 may be removed from the leadframes 22–26. Further, the leadframes are here shown to be joined to each other in a continuous strip form. In the manufacturing process subsequent to that herein illustrated and discussed, adjacent leadframes such as leadframes 22 and 23, for example, are also separated one from the other for further processing.

The application means may include a block 88 positioned above the application structure 30. As hereinbefore noted, each leadframe, such as leadframe 23, has a first portion 90 of a die site to receive a first increment of the first length 14. The first increment may also be referred to as a decal. The first increment or decal is urged upward by a die through a first die aperture 92 in the application structure 30. Similarly, a second increment or decal is urged upwardly by a second die through a second die aperture 94 to position the second decal or increment at a second site such as second portion 96 of a die site. As the leadframes 22–26 move 98 by operation of the indexing structure 20, the first portion 90 of a die site is positioned relative to the first die aperture 92. Activation of the application structure 30 by the controller 32 causes the application structure to apply the first increment or first decal through the first die aperture 92 to a leadframe and, more particularly, to the first portion 90 of a die site of a leadframe such as leadframe 23 of the plurality of leadframes. Similarly, on positioning of the second portion 96 of a die site relative to the second die aperture 94, the controller 32 causes the application structure 30 to operate and, in turn, apply the second increment or second decal through the second die aperture 94 to the second portion 96 of a die site of a leadframe such as leadframe 23 of the plurality of leadframes 22–26.

In operation, the first leadframe, such as leadframe 23, is indexed to position the first portion 90 of a die site relative to the first die aperture 92. In turn, the controller 32 activates the stepping motor 50 via conductor 52 to, in turn, operate the drive roller 46 of the first drive structure 36. In turn, the first length 14 is urged toward the application structure 30 so that the first increment or first decal can thereby be formed by the application structure as more fully discussed hereinafter. With the first portion 90 of a die site of the leadframe 23 positioned relative to the first die aperture, and with no second portion of a die site, such as of leadframe 24, positioned relative to the second die aperture 94, the controller 32 does not activate the second stepping motor 64. In turn, the second length 18 is not urged toward the application structure 30. In turn, the second increment or decal is not formed and is not urged upward through the second die aperture 94. A savings in adhesively coated tape material is thereby realized. Further, adhesively coated tape material 55 is not applied upward against the block 88 and does not build up over time to interfere with the quality and operation of the system 10. That is, the adhesively coated tape material can build up and interfere with the smooth operation of the system and to potentially interfere with the quality of a particular leadframe of the plurality of leadframes.

The controller 32 here illustrated may be any combination of electronic and electromechanical devices having an input structure, to receive input data pertaining to the desired speed as well as the length of the increments and the size (e.g., length) of the leadframes. Preferably, a computing structure is positioned therewith to generate signals to, in turn, cause electromechanical devices to supply electrical energy via a plurality of relays and conductors. The electrical energy is received from the conventional sources of electrical energy via a conductor 100. A plurality of relays or the equivalent thereof in the controller 32 is activated to supply electrical energy via conductors 68 and 52 to their respective stepping motors 64 and 50, as well as to activate the application structure 30, all to form and apply the first increment and the second increment from the first length 14 and the second length 18 of the adhesively coated tape materials 35 and 55. Similarly, relays or their equivalent are activated to supply signals via conductor 76 to, in turn, cause the motor 74 to index and to drive the plurality of leadframes 22–26 relative to the application structure 30.

Although the controller 32 may be configured to operate the block 88, the block 88 may be separately powered from an external source via conductor 102. The block 88 is heated to, in turn, heat the adhesive coating on the first length of tape 14 and the second length of tape 18 so that the adhesive will, in turn, adhere to each leadframe of the plurality of leadframes 22–26.

Figure 2:
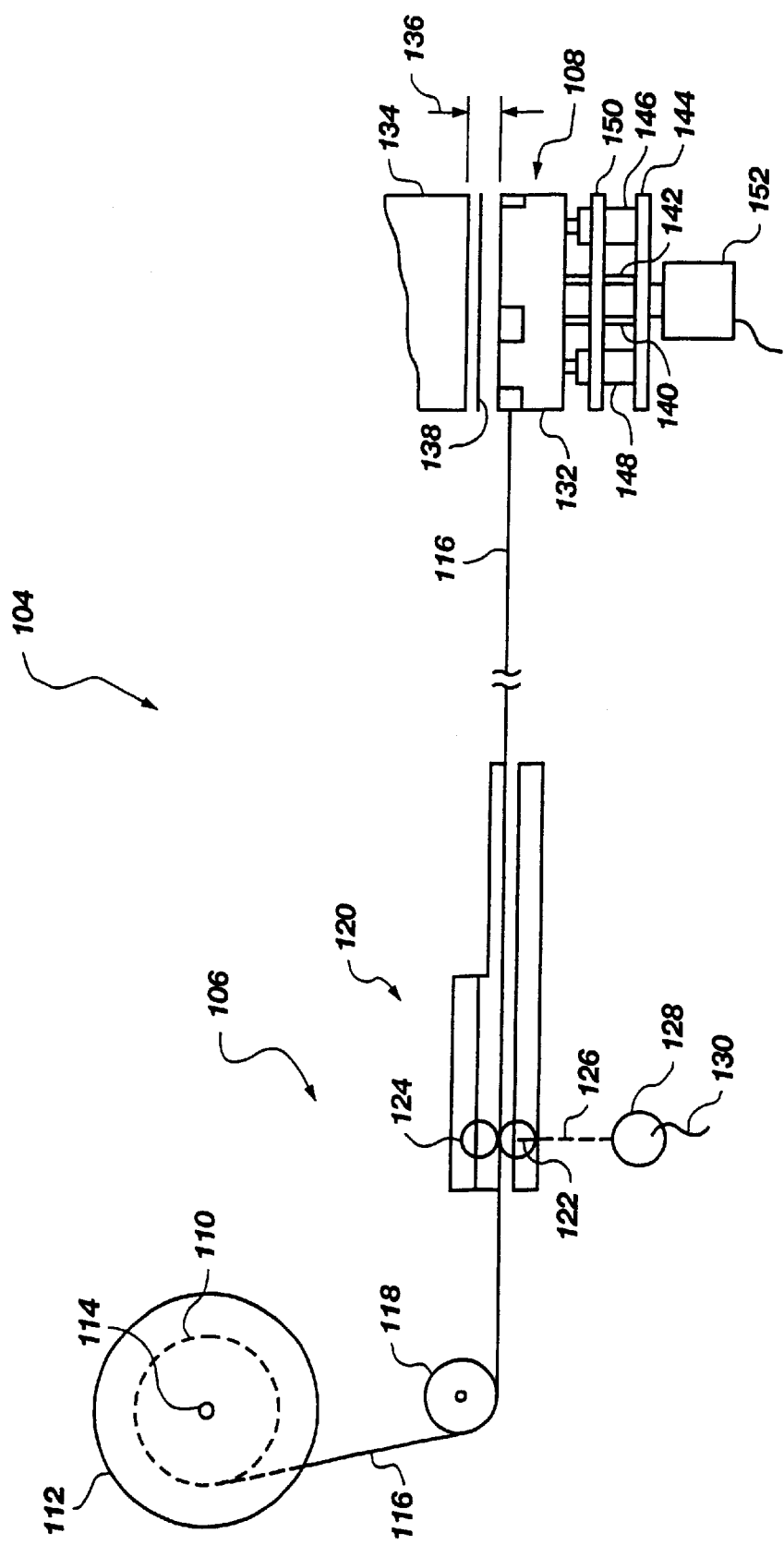
FIG. 2 is a side view of an alternate configuration of the system of the present invention.

Referring now to drawing FIG. 2, a system 104 similar to system 10 includes a source of adhesively coated tape material 106 along with application structure 108. The source of material 106 includes a first roll of adhesively coated tape material, not illustrated, as well as a second roll 110 of adhesively coated tape material positioned to be rotatably dispensed from reel 112. The reel 112 rotates freely about an axle 114 to form a second length 116. The second length 116 and a first length (not shown) pass about first guide structure 118 that includes rollers similar to the first guide 42 and second guide 58 shown in FIG. 1. The second length 116 and the first length (not shown) pass into the driving structure 120 that includes a first drive roller 122 and a second drive roller 124. A first driven roller (not shown) and the first drive roller (not shown) have the first length (not shown) passing therebetween. A second drive roller 124 and a first drive roller 122 are shown with the second length 116 passing therebetween. A dotted line 126 represents an axle connection between the second drive roller 122 and a second stepping motor 128. The second stepping motor 128 is connected by conductor 130 to a controller (not here shown) similar to controller 32. The first length from the first source (not shown) is similarly driven by a first stepping motor (not shown).

As here shown, the application structure 108 includes a base 132 which is positioned spaced apart a distance 136 from a block 134 similar to block 88. The distance 136 is exaggerated in FIG. 2 to facilitate illustration and is selected to provide for passage of a plurality of leadframes 138 while providing an anvil or backing for a first die 140 and a second die 142.

As illustrated in drawing FIG. 2, the first die 140 and the second die 142 pass upward through the base 132 and other structure to cut and apply respectively a first increment of the first length and a second increment of the second length 116 to each portion of a die site of a leadframe of a plurality of leadframes 138. As here shown, the first die 140 and the second die 142 are urged upwardly by die plate 144. The die plate 144 passes over bushings such as bushings 146 and 148 and through a shoe 150. A solenoid 152 is positioned to urge the die plate 144 upward in order to urge the first die 140 and the second die 142 upward against a leadframe of the plurality of leadframes 138. If desired, the die plate 144 may comprise two or more independently actuated die plates, each being actuated by its own separate solenoid 152 from independent signals from the controller 32.

Figure 3:
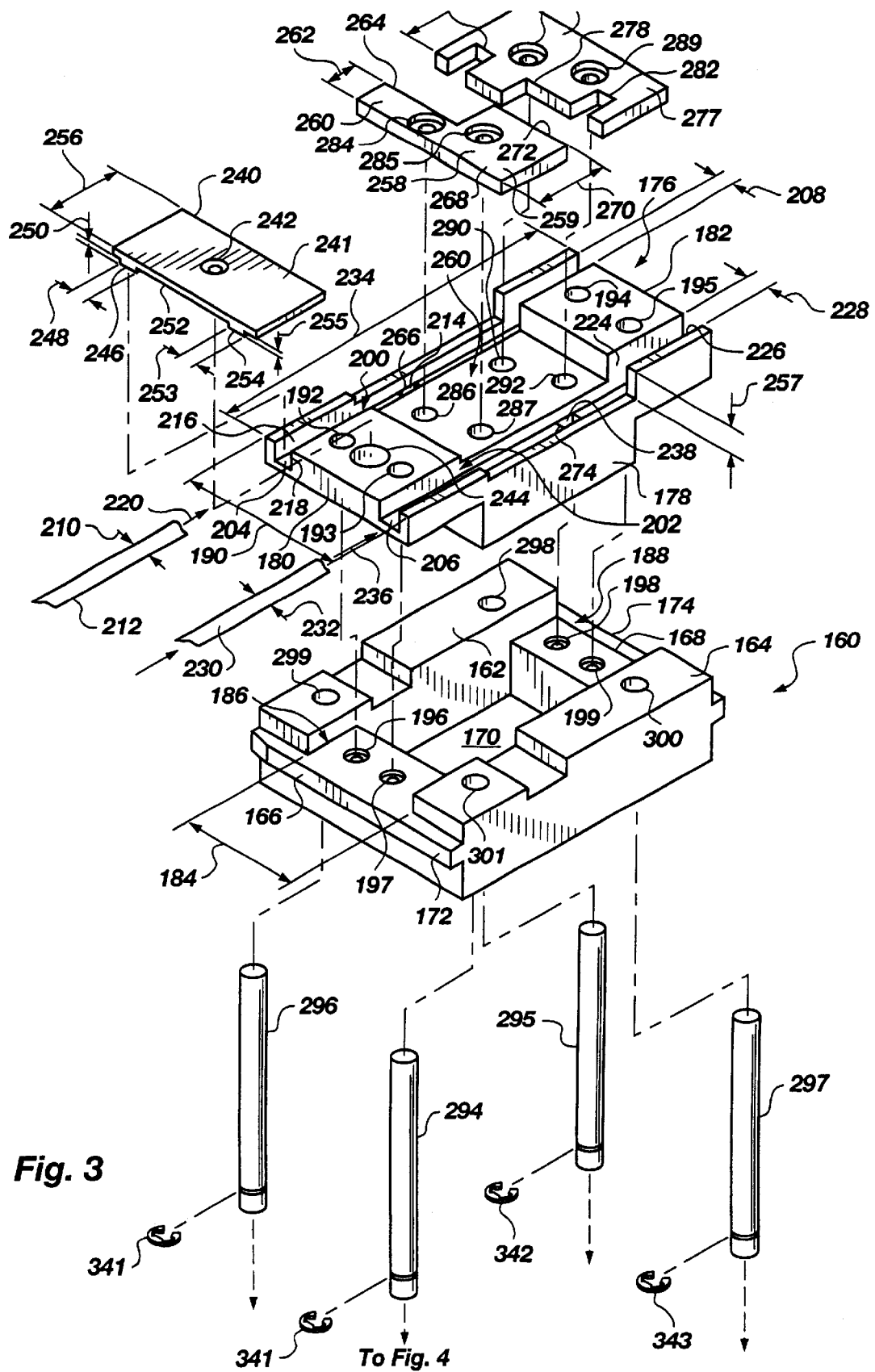
FIGS. 3 and 4 both together are an exploded view of an application mechanism of the present invention.
Figure 4:
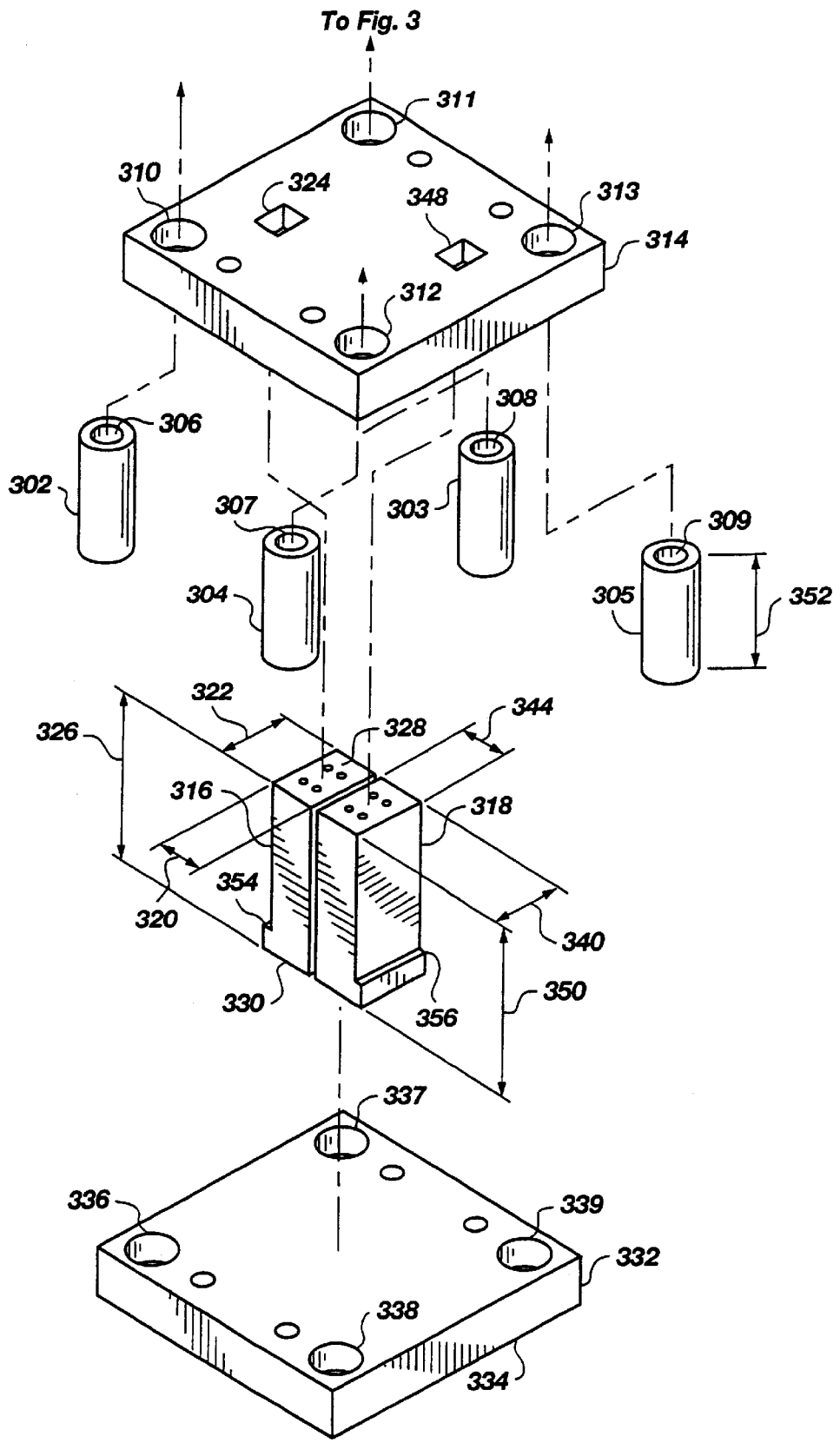

Turning now to drawing FIGS. 3 and 4, an application structure is shown in an exploded perspective format. As can be seen from the bottom of drawing FIG. 3 and the top of drawing FIG. 4, the components illustrated in drawing FIG. 4 interconnect with the structure at the bottom of drawing FIG. 3, all as more fully discussed hereinafter. The application structure illustrated in drawing FIGS. 3 and 4 is suitable for use as the application structure 30 illustrated in drawing FIG. 1 and the application structure 108 illustrated in drawing FIG. 2.

As illustrated in drawing FIG. 3, a base 160 is shown formed to be generally rectilinear in shape as illustrated. It has a left side 162 spaced apart from a right side 164. A front cross member 166 and the rear cross member 168 extend between and space the left side member 162 from the right side member 164. The left side member 162, the right side member 164, the front cross member 166 and the rear cross member 168 are arranged in a rectilinear fashion as shown to define an opening or volume 170.

The front cross member 166 has a front lip 172 and the rear cross member has a rear lip 174, both of which are provided for attachment to external supporting structure.

A punch guide insert 176 is formed with a central portion dimensioned to snugly and slidably fit within the opening 170. A forward portion 180 and a rear portion 182 are sized to snugly fit between the left side 162 and the right side 164 of the base 160. More specifically, the left side 162 and the right side 164 are spaced apart a distance 184 and, in turn, define a front notch 186 and a rear notch 188. The forward portion 180 is sized in width 190 to be substantially the width 184 to, in turn, facilitate a snug relationship when the forward portion 180 is positioned in the front notch 186. Of course, the rear portion 182 similarly fits snugly in the rear notch 188.

Upon positioning of the punch guide insert 176 with the center portion 178 in the opening 170, and the forward portion 180 in the front notch 186 and the rear portion 182 in the rear notch 188, it can be seen that apertures 192–195 formed in the punch guide insert 176 align with corresponding apertures 196–199 formed in the base 160 and, more particularly, in the front cross member 166 and the rear cross member 168. Appropriate fasteners, such as screws, may be used to fasten the punch guide insert 176 to the base 160.

The punch guide insert 176 has a left tape guide 200 and a right tape guide 202. It can be seen that the left tape guide 200 and the right tape guide 202 are both C-shaped in cross section, providing lower left flat surface 204 and lower right flat surface 206, respectively. It can be seen that the left tape guide 200 has a width 208 which is sized to be comparable to the width 210 of a first length 212 of adhesively coated tape material which is comparable to the first length 14 shown in FIG. 1. Thus, the first length 212 of adhesively coated tape material can move in and be guided and aligned by the left tape guide 200 as the first length moves toward a first die aperture 214 which is similar to the first die aperture 92 shown in drawing FIG. 1. Notably, the left flat surface 204 is planar or substantially level and fabricated of a metal material that will minimize the amount of friction between the left flat surface 204 and the first length 212. It may also be noted that the left tape guide 200 has a left side wall 216 and a right side wall 218 in order to provide lateral support for the first length 212 and, more particularly, to guide the first length 212 as it moves toward the first die aperture 214. The left tape guide 200 provides for movement of the first length 212 in a direction 220. In other configurations, the left tape guide 200 may provide for movement of a first adhesively coated tape material opposite to direction 220.

It can also be seen that the right tape guide 202 is formed to be similar in configuration to the left tape guide 200. More specifically, the right tape guide 202 has a left side wall 224 and a right side wall 226. The width 228 of the right tape guide 202 is selected to provide for a snug but slidable fit of the second length 230. More particularly, the width 228 of the right tape guide 202 is selected to be substantially the same as, but slightly more than, the width 232 of the second length 230. Similarly, the right tape guide 202 extends along the full length 234 of the punch guide insert 176 so that a second length, such as second length 230, may move in a direction 236 from the forward portion 180 to the rear portion 182 as shown or in a direction opposite to direction 236.

As can be seen in drawing FIG. 3, the second length 230 is sized to move from the forward portion 180 through the right tape guide 202 toward the second die aperture 238. The right flat surface 206 is flat or planar, similar to the left flat surface 204.

The punch guide insert 176 may be fabricated from any material suitable for movement of the first length 212 and the second length 230. An ASST steel has been found to be suitable; but any other similar steel alloys that provide for a low friction relationship between the adhesively coated tape material and, more particularly, the second length 230 and the right flat surface 206 is desired.

It should also be noted that the width 208 of the left tape guide and the width 228 of the right tape guide may be substantially identical. Alternatively, the width 208 and the width 228 may vary in order to accommodate tape material of different widths which may be selected as desired by the user.

As further seen in drawing FIG. 3, a tape lead-in guide 240 is shown to be connectable through an aperture 242 by a screw (not shown) interconnecting to a corresponding aperture 244 formed in the forward portion 180 of the punch guide insert 176. The tape lead-in guide 240 has a left channel insert 246 which has a width 248 selected to snugly fit within the left tape guide 200. The left channel insert 246 extends downwardly a distance 250 from the undersurface 252 of the tape lead-in guide 240. The distance 250 is selected to provide an upper guide surface for the first length 212. Similarly, a right channel insert 254 is sized to extend downwardly a distance 255 and width 253 to snugly fit within the right tape guide 202 to provide an upward guide surface for the second length 230. The tape lead-in guide 240 is sized in length 256 a distance selected to provide for a left channel insert 246 and a right channel insert 254 of sufficient length 256 to stably guide the first length 212 and the second length 230.

As illustrated in drawing FIG. 3, a cutter block 258 is shown having a left recess portion 260 sized in length 262 a distance so that upon installation, the rear edge 264 is positioned proximate the front edge 266 of the first die aperture 214 in the punch guide insert 176. Therefore, a die (e.g., die 142 illustrated in drawing FIG. 2) passing upwardly through the first die aperture 214 will urge the first length 212 upwardly past the rear edge 264 to, in turn, cause an increment or decal of the first length 212 to be formed and to be urged upwardly toward a portion of a die site of a leadframe of a plurality of leadframes.

Similarly, the right portion 268 of the cutter block 258 is sized in length 270 so that, when installed, the rear edge 272 is positioned proximate the front edge 274 of the second die aperture 238. Therefore, the second length 230, upon positioning over the second die aperture 238, can be formed into a second increment as it is urged past the rear edge 272 of the right portion 268 to thereby form the second increment or decal which is, in turn, urged upward toward a portion of a die site of a leadframe of a plurality of leadframes. It should be understood that the use of the word "second" is intended to infer that it is second in sequence and to distinguish it from the other or first increment or decal.

A guide insert 276 is also shown in drawing FIG. 3 having a front edge 278 formed to mate with the rear edges 264 and 272 of the cutter block 258. Notches 280 and 282 are formed to register with the first die aperture 214 and the second die aperture 238 so that a die may be urged upward there past with the first increment of the first length 212 and so that a die may be urged upward there past with the second increment or second decal of the second length 230.

Apertures 284 and 285 are provided in the cutter block 258 to receive screws for interconnection with corresponding apertures 286 and 287 formed in the punch guide insert 176. Similarly, apertures 288 and 289 are formed in the guide insert 276 to receive screws for threaded interconnection to correspond to the apertures 290 and 292 formed in the punch guide insert 176.

Four guide posts 294–297 are also shown in drawing FIG. 3. They are sized in cross section to snugly fit within the corresponding apertures 298–301 formed in the base 160. Screws, or any other suitable structure, may be provided to snugly secure the posts 294–297 within the corresponding apertures 298–301. Four bushings 302–305, shown in drawing FIG. 4, are sized with interior apertures 306–309 to snugly and slidably fit over the posts 294–297. The bushings 302–305 also slidably fit through corresponding apertures 310–313 formed in a punch shoe 314. A left die 316 is also shown in drawing FIG. 4. The left die 316 has a width 320 and a length 322 selected to snugly fit within the punch shoe die aperture 324 and to correspondingly register with and slide snugly through the first die aperture 214 in the punch guide insert 176 shown in drawing FIG. 3. Further, the left die 316 will pass through the notch 280 as it proceeds upwardly toward a semiconductor device leadframe which is passing over the top surface of the application structure, which top surface is comprised of the top surface 241 of the tape lead-in guide 240 and the corresponding top surface 259 of cutter block 258 and the top surface 277 of the guide insert 276. That is, the left die 316 is sized in height 326 to extend upwardly a distance so that the top surface 328 contacts the leadframe of a plurality of leadframes of semiconductor devices passing over the top surfaces 241, 259 and 277 in order to adhere a first increment of the first length 212 to a portion of a die site of a leadframe of the plurality of leadframes, such first site being selected by positioning a leadframe of each of the plurality of leadframes in a desired location and by selecting the width 190 of the punch guide insert 176 and, more particularly, the distance between the left tape guide 200 and the right tape guide 202.

Now referring back to drawing FIG. 4, the underside 330 of the left die 316 rests against a punch plate 332. A solenoid, or other similar device to cause upward motion of the punch plate 332, is positioned against the underside 334 of the punch plate to urge the plate upward and, in turn, urge the bushings 302–305 and the left die 316 and the right die 318 upwardly through the punch shoe 314 as more fully discussed hereinafter. The bushings 302–305 extend downward through corresponding apertures 336–339 formed in the punch plate 332. The bushings 302–305, as well as the punch plate 332, the left die 316 and the right die 318, as well as the punch shoe 314, are all held in place by retaining rings 340–343 shown in drawing FIG. 3.

Referring back to drawing FIG. 4, the right die 318 has a width 344 and a length 340 selected to register with a corresponding punch shoe right die aperture 348 formed in the punch shoe 314. The right die 318 has a height 350 selected to extend upward through the punch shoe right die aperture 348 and through the second die aperture 238 formed in the punch guide insert 176 and also through the right notch 282 formed in the guide insert 276 for further travel to affix a second increment or decal formed from the second length 230 of adhesively coated tape material in a preselected second portion of a die site of a leadframe of a plurality of leadframes.

It may be noted that the left die 316 and the right die 318 are here shown to be of substantially identical width 320 and 344, respectively, as well as substantially identical lengths 322 and 340, respectively. The left die 316 and the right die 318 also have substantially identical heights 326 and 350. The lengths 322 and 340, as well as the widths 344 and 320, may vary based on the size of the decal or increment desired to be applied to each leadframe of a plurality of leadframes of semiconductor devices.

It may be noted that the distance the left die 316 and the right die 318 travel past the surface, defined by the surfaces 241, 259 and 277 (FIG. 3), is controlled by the height 352 or length of each of the bushings 302–305. It may also be noted that the left die 316 and the right die 318 each have a respective shoulder 354 and 356 to preclude driving the dies 316 and 318 through the corresponding punch shoe left die aperture 324 and the punch shoe right die aperture 348.

It should be understood that in operation a driving mechanism, such as a solenoid 152 shown in drawing FIG. 2, operates to urge the punch plate 332 upward to, in turn, drive the left die 316 and right die 318 upward through the punch shoe 314 and through the first die aperture 214 and the second die aperture 238. Mechanisms, other than a solenoid, may be used to urge the punch plate upward. For example, a mechanical cam structure may be provided, as well as a hydraulic piston or any other similar device which provides vertical or upward force sufficient to drive the left die 316 and the right die 318. It may be noted that the total travel of the left die 316 and the right die 318 is such that, at a low point, the tops are slightly below the level of the flat surfaces 204 and 206 and at the high point the tops are slightly above what is essentially a flat surface defined by the surfaces 241, 259 and 277 (FIG. 3). Thus, the travel was slightly more than the height 257 of the recess portion 260 which is sized to receive the cutter block 258 and the guide insert 276.

Figure 5:
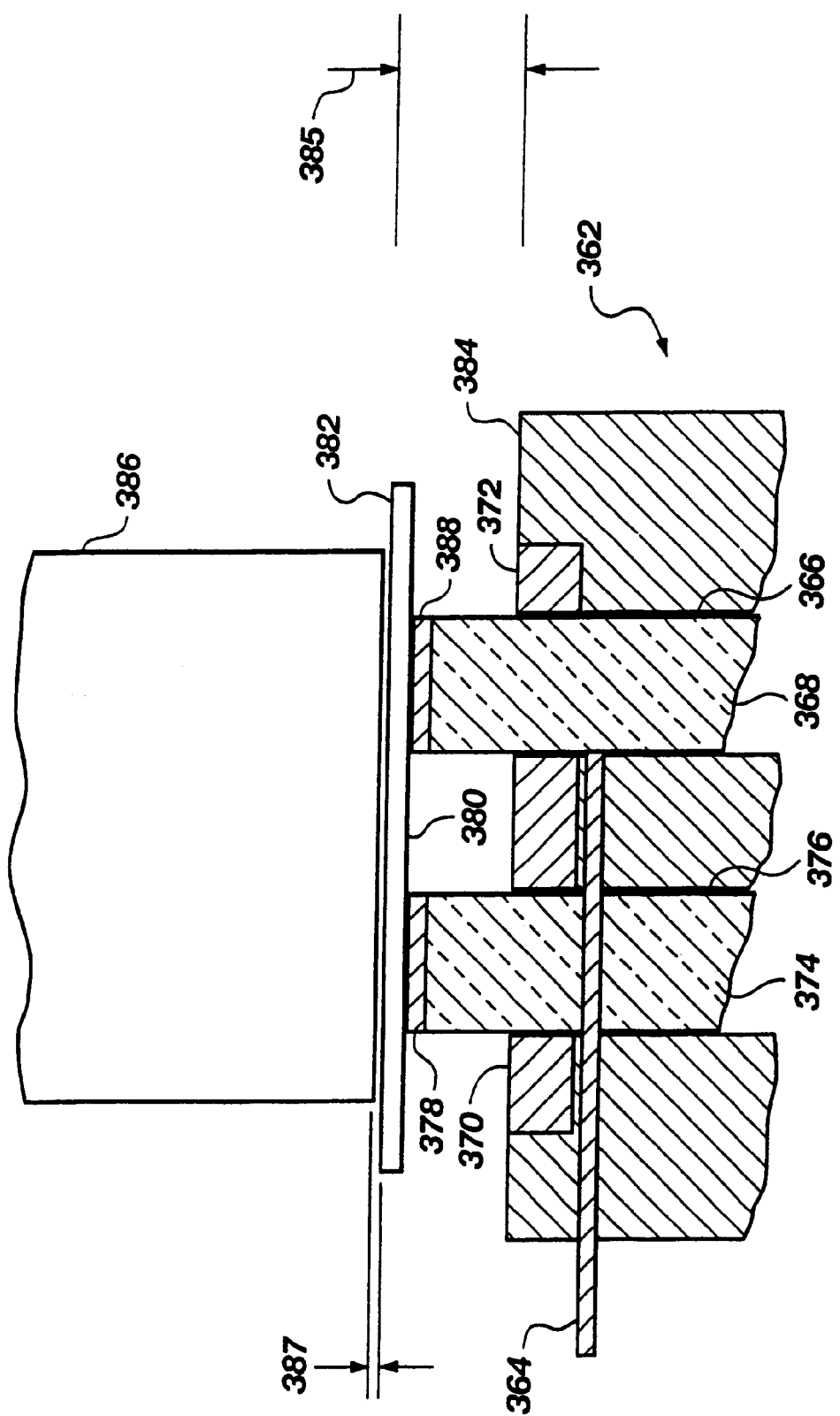
FIG. 5 is a simplified cross-sectional side view of a portion of the application structure of FIGS. 3 and 4.

Turning to drawing FIG. 5, a simple side view of an application structure 362, similar to the application structure of drawing FIGS. 3 and 4, as well as the application structures 30 and 108, is depicted. A second length of adhesively coated tape material 364 from a supply of adhesively coated tape material extends through the application structure 362 to a second die channel 366. That is, the application structure 362 has a channel 366 sized to snugly and slidably receive a second die 368 to move past a cutter block 370 and a corresponding guide insert 372 comparable to the cutter block 358 and the punch guide insert 176 of drawing FIG. 3.

Similarly, a first die 374 is shown positioned in a first die channel 376 for snug but slidable movement therein. A first length of adhesively coated tape material from a first supply of adhesively coated tape material extends toward the first die channel 376. The first die moves upward past the cutter block 370 to thereby form a first increment or first decal 378. The first die 374 positions and forcibly urges the first decal 378 to the underside 380 of a leadframe 382 of a plurality of leadframes which are passing over upper surface 384 of the application structure 362.

The block 386 is comparable to block 134 and block 88 (FIG. 1) and is here shown spaced away from the upper surface 384 a distance 385 that is exaggerated to facilitate illustration. The block 386 is also shown spaced away from the leadframe 382 an exaggerated distance 387 to show that the leadframe 382 slidably moves proximate the block 386. In practice, the distance 385 and the distance 387 is selected (e.g., 5–10 millimeters) so that the leadframes 382 readily move between the block 386 and the surface 384. At the same time, the distances 385 and 387 are selected so the block 386 functions as an anvil without appreciably distorting, deflecting or bending the leadframe 382.

Dies 374 and 368 illustrated in drawing FIG. 5, are shown in an upward position respectively, the first increment or decal 378 as well as a corresponding second decal or second increment 388. That is, the second die 368 moves upward, urging the adhesively coated tape material of the first increment 378 past the cutter block 370 to, in turn, form the second decal or increment 388 and to further urge the second decal or increment 388 upward against the underside 380 of the leadframe 382 at a site selected by the dimensioning of the apparatus and by the movement of the leadframe 382 relative to the application structure 362. Similarly, the first die moves upward to form and position the first decal or increment 378.

Figure 6:
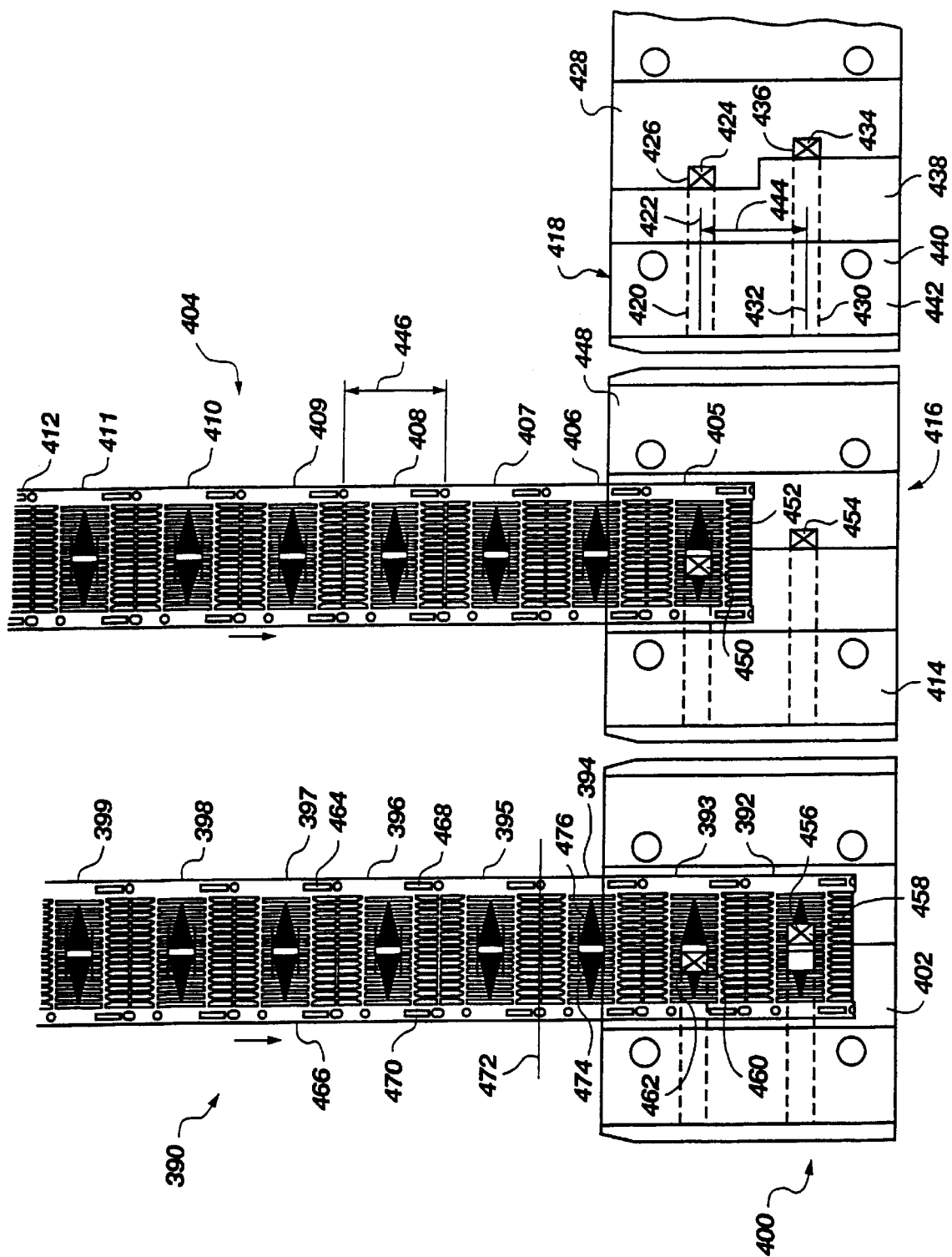
FIG. 6 is a simplified depiction of the top portions of application structures of the present invention.

Referring now to drawing FIG. 6, a first plurality of leadframes 390 for semiconductor devices is shown consisting of leadframes 392–399. The leadframes are positioned to move toward first application structure 400 and, more particularly, over the top surface 402 of the first application structure 400. A second plurality of leadframes 404 has leadframes 405–412 positioned to move over the top surface 414 of a second application structure 416. A third application structure 418 is also shown. Although the first application structure 400, second application structure 416 and the third application structure 418 are all shown in side-by-side relationship, such orientation is strictly for purposes of illustration.

Referring to the third application structure 418, first tape guide 420 is shown having a central axis 422. The top 424 of a first die is shown in its first die channel extending upwardly through a first die notch 426 formed in a guide insert 428. Similarly, a second tape guide 430 is shown having a central axis 432. The top 434 of a second die is shown extending upwardly through a second notch 436 in the guide insert 428. The guide insert 428 is positioned proximate a cutter block 438 which, in turn, is adjacent the top surface 440 of a tape lead-in guide 442. As can be seen, the central axis 422 of the first tape guide 420 is spaced from the central axis 432 of the second tape guide 430 a distance 444 which may be said to be one leadframe or one pitch. In the preferred illustrations, the distance 444 in fact is equivalent to the overall length 446 of each leadframe 392–399 and 405–412 of the respective pluralities of leadframes 390 and 404. The length 444 may be a pitch which is different than the length 446 for those leadframes having more than two sites for a first increment or decal and/or a second increment or decal. In typical applications such as that here illustrated, one pitch equals the length 446 of one leadframe.

Referring now to the second application structure 416, it can be seen that the second plurality of leadframes 404 is positioned with a first leadframe 405 having its first position of a die site positioned over the top of the first die or relative to the first die to receive the increment of the first decal therefrom. With indexing means urging the plurality of leadframes 404 across the face or top surface 448 of the second application structure 416, it can be seen that the first site 450 moves away from the top of the first die, such as the top of the first die 424, so that the second site 452 is positioned over the top of or relative to the top 454 of the second die. Thus, as shown with respect to the first application structure, a first leadframe 392 has its second site 456 positioned over the top 458 of a second die while the second or any middle leadframe 393 has its first site 460 positioned over the top 462 of the first die.

In reference to the first plurality of leadframes 390 and the second plurality of leadframes 404, it can be seen that each has leadframes joined one to the other. The leadframes have removable edges 464 and 466 each formed with notches or apertures 468 and 470 which are used in association with indexing means to urge the plurality of leadframes 390 and 404 to move relative to the application structures 400 and 416. It may also be noted that a last leadframe such as, for example, leadframe 394, will proceed over the top surface 402 of the first application structure 400. That is, if the plurality of leadframes 390 is severed along a line 472, leadframe 394 becomes a last leadframe in which first site 474 is positioned relative to the top 462 of the first die, after which its second site 476 is positioned over the top 458 of the second die. When the second site 476 is positioned over the top 458 of the second die, the top 462 of the first die is exposed and does not have a leadframe or a leadframe with a first site positioned thereover. Thus, a first increment or decal proceeding upward does not have a site against which it is to be positioned. In the event the first length of the supply of adhesively coated tape material is advanced over the first die, a first increment would be formed and could potentially attach to the underside of a block such as, for example, block 386. In turn, the potential for contamination with unused increments is evident.

As hereinafter discussed, the controller 32 sends operation signals to drive structures 36 and 60 (FIG. 1) to advance the first length 14 and the second length 18 over the tops of their respective dies so that a first increment or first decal and a second increment or second decal can thereby be formed and attached at their respective first sites and second sites of each of the leadframes of the plurality of leadframes without advancing a second increment when the first leadframe is not yet positioned thereover and not forming and advancing a first increment when the last leadframe is no longer positioned over the top of the first die.

Referring now to drawing FIGS. 7 through 11, drive structures suitable for use as a first drive structure 36 shown in drawing FIG. 1 and a second drive structure 60 shown in FIG. 2 are depicted in an exploded perspective format. The illustrations of drawing FIGS. 7 through 11 are somewhat simplified to facilitate understanding.

Figure 7:
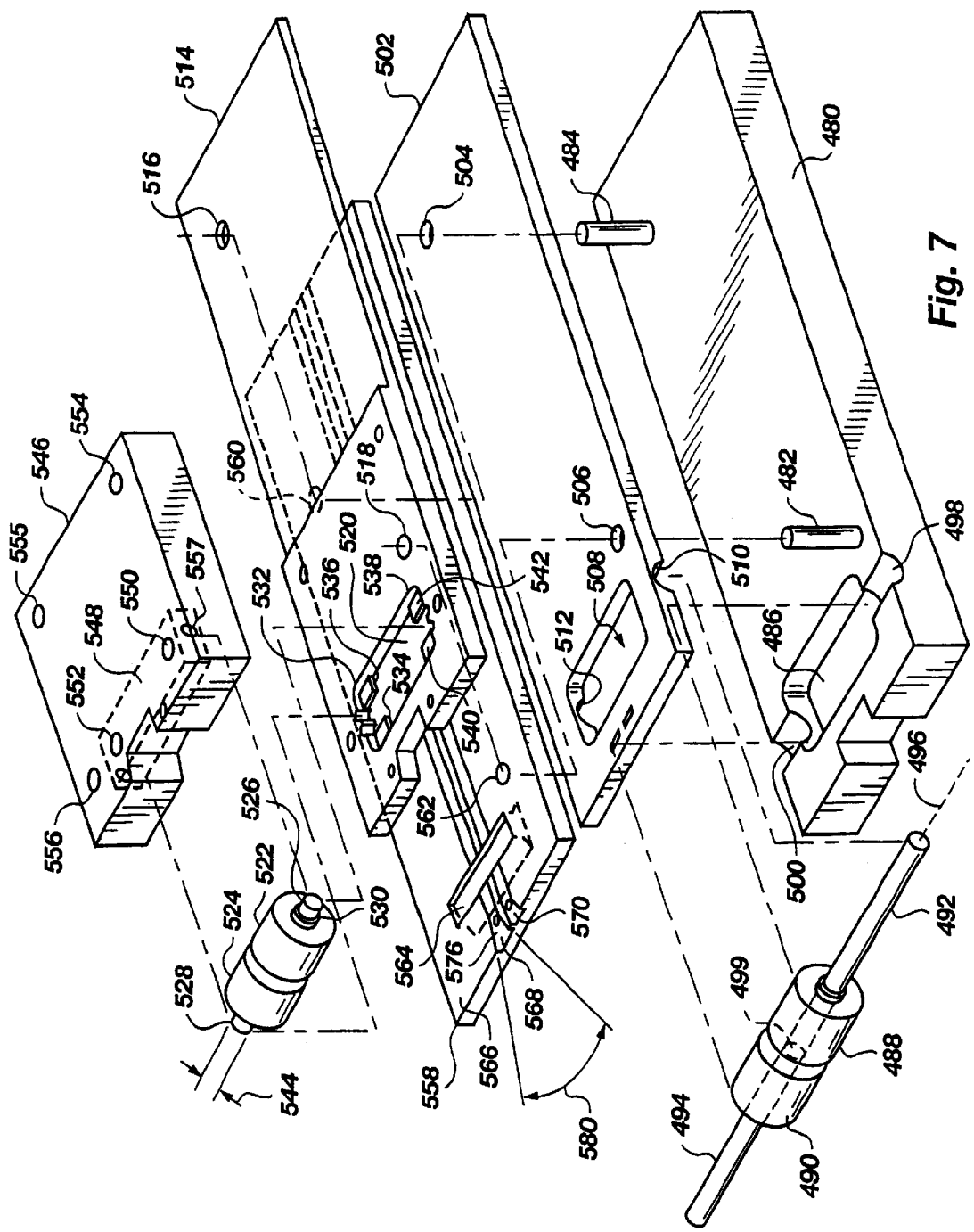
FIG. 7 is an exploded perspective rendition of drive structure for urging adhesive tape toward the application structure of the present invention.
Figure 11:
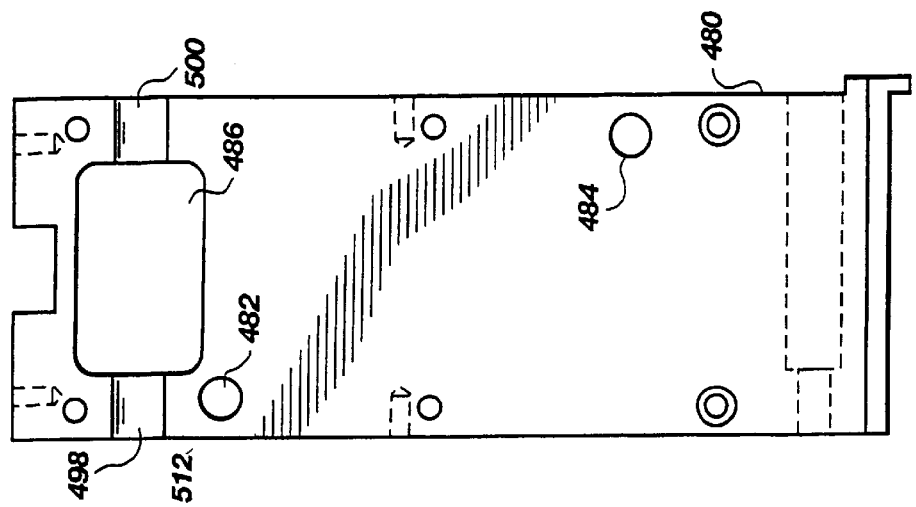
FIGS. 8 through 11 show several components of the driving structure of FIG. 7.

In drawing FIGS. 7 and 11, a lower roller base 480 is shown with a forward alignment pin 482. The lower roller base 480 has a recess 486 formed therein sized to rotatively receive therein a lower right roller 488 and a lower left roller 490.

The lower right roller 488 is mounted to a right axle 492 and rotates independent of and relative to the lower left roller 490, which itself is mounted to the left axle 494 to rotate about a common axis 496. If the rollers are fixedly secured to their axles 492 and 494, the axles 492 and 494 are joined at a slip joint 499 between the lower left roller 490 and lower right roller 488. The respective right axle 492 and left axle 494 are positioned in and corresponding to the right lower bearing half 498 and the left lower bearing half 500.

Figure 10:
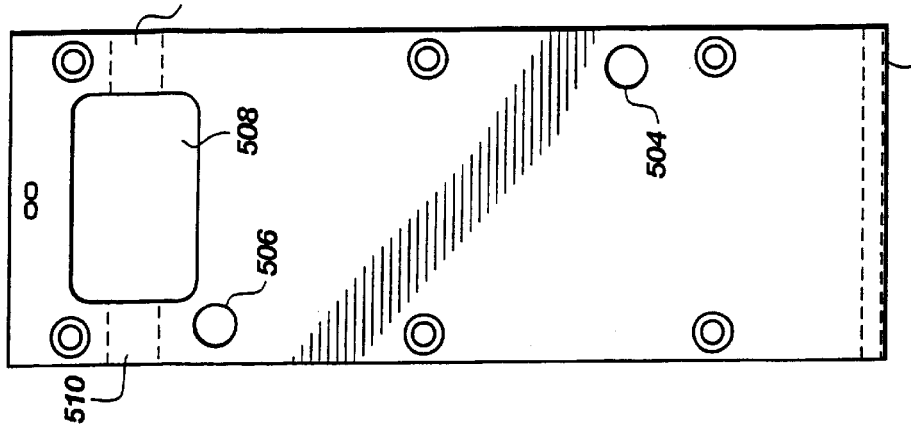

In drawing FIGS. 7 and 10, a lower roller top housing 502 is shown with a rear aperture 504 positioned to register with the upwardly extending rear alignment pin 484 and a front alignment aperture 506 positioned to register with the forward alignment pin 482. A roller recess 508 is formed in the lower roller top housing 502 to register with and receive the lower right roller 488 and lower left roller 490. A right upper bearing half 510 and a left upper bearing half 512 is formed to receive the right axle 492 and the left axle 494, respectively. That is, the right lower bearing half 498 and the right upper bearing half 510 together form a bearing to receive and support the right axle 492 therewithin. Similarly, the left lower bearing half 500 and the left upper bearing half 512 together receive the left axle 494 therewithin.

Figure 9:
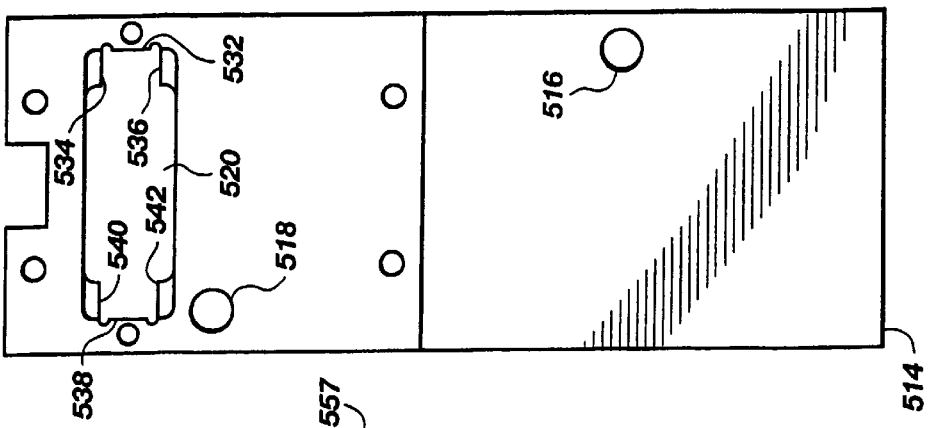
Figure 8:
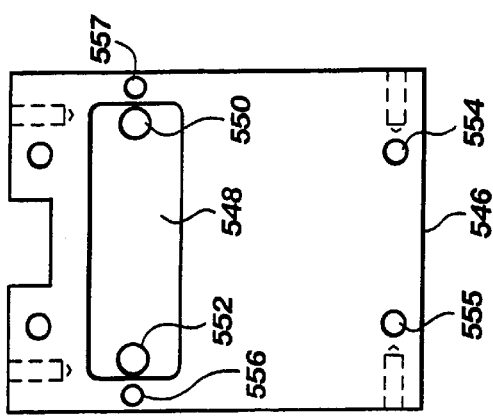

An upper roller base 514 is also shown in drawing FIGS. 7 and 9 with a rear alignment aperture 516 positioned to register with the rear alignment pin 484 extending upwardly from the lower roller base 480. Similarly, the upper roller base 514 has a forward alignment aperture 518 positioned to register with the forward alignment pin 482 extending upwardly from the lower roller base 480.

The upper roller base 514 has upper roller recess 520 formed therein to receive a right upper roller 522 and a left upper roller 524. The right upper roller 522 and left upper roller 524 are both rotatively mounted about an axle 526 having a left end 528 and a right end 530. The recess 520 has at its left end 532 a pair of tabs 534 and 536 spaced apart to receive and support the left end 528 of the axle 526. The tabs 534 and 536 are spaced apart a distance less than the diameter 544 of the common axle 526 at the left end 528. Similarly, at the right end 538 a pair of spaced tabs 540 and 542 are spaced apart a distance less than the diameter 544 of the common axle 526. Therefore, the left end 528 and the right end 530 of the common axle 526 are rigidly supported in the recess 520 to preclude general fore and aft movement upon attachment thereto of the upper roller top housing 546.

The upper roller top housing 546 (FIGS. 7 and 8) has a roller recess 548 formed therein to rotatively receive therewithin the left upper roller 524 and the right upper roller 522. Apertures 550 and 552 are positioned to threadedly receive set screws therethrough to contact the corresponding right end 530 of the common axle 526 and the left end 528 of the common axle 526 to thereby rigidly hold the common axle 526 in place while providing for free rotation of the right roller 522 and the left roller 524 thereabout. Notably, the upper roller top housing 546 is secured to the upper roller base 514 through the use of screws associated with a plurality of apertures 554–557.

Positioned between the upper roller base 514 and the lower roller top housing 502 is a tape guide 558. The tape guide has an aperture 560 positioned to receive the rear alignment pin 484 in order to align the tape guide 558 relative to the lower right roller 488, lower left roller 490, upper right roller 522 and upper left roller 524. It also has a forward alignment aperture to align with the forward alignment pin 482.

The tape guide 558 has a roller recess 564 sized to receive the left lower roller 490 and right lower roller 488 therein to extend just barely above the top surface 566 of the tape guide 558. The lower left roller 490 and lower right roller 488 will contact the first length of adhesive tape supplied from the source of adhesive tape along a right tape track 570, a left tape track 568 and a second source for a second length of adhesive tape supplied from a second source along a right tape track 570. The left tape track 568 and the right tape track 570 are formed of material to provide for reduced friction so that the first length and the second length of adhesive tape may slide smoothly thereover. The left tape track 568 and the right tape track 570 may be slightly recessed to guide the left length and the right length and inhibit lateral movement thereof.

It may be noted that the left roller 490 and the right roller 488 extend upwardly through the roller recess 508 and the roller recess 564 to drivingly engage respectively the first length of adhesive tape and the second length of adhesive tape. The right upper roller 522 is positioned as a driven or idler roller with the second length passing between the driven upper right roller 522 and the driving right lower roller 488. Similarly, the left lower roller 490 drives the left upper roller 524 with the first length of adhesive tape passing therebetween.

The right axle 492 extends outwardly for inner connection to a stepping motor or other means for rotating the axle 492 incrementally to advance the second length a preselected distance to, in turn, provide the desired length of the second decal or second increment. Similarly, a stepping motor or other means is associated with the left axle 494 to drive the left roller 490 to, in turn, advance the first length of adhesively coated tape material a desired distance or length to provide for the correct dimensions or desired dimension of the first increment or decal of adhesively coated tape material for application to each leadframe of a plurality of leadframes.

Figure 12:
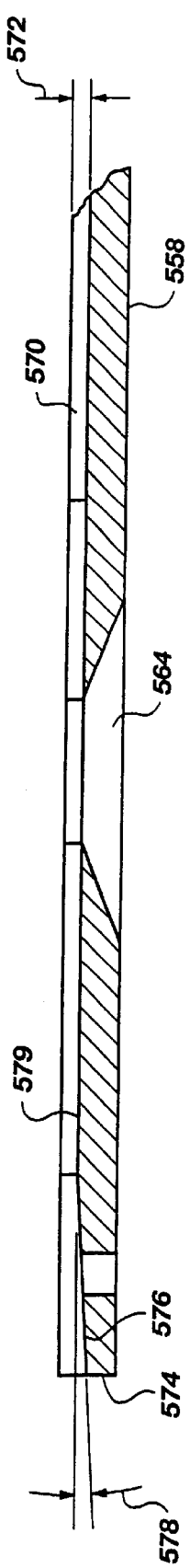
FIG. 12 is a partial cross-sectional side view of a portion of the structure of FIG. 10.

Referring now to drawing FIG. 12, a forward portion of the tape guide 558 is illustrated in partial cross-section. The left tape track 568 is shown recessed a depth 572 that is greater than the thickness of the adhesively coated tape material so that the left tape track 568 functions as a guide for the adhesively coated tape material. The right tape track 570 is similarly formed with a depth comparable to depth 572.

At the front end 574 of the tape guide 558, an entry surface 576 is formed at an angle 578 extending downwardly so that the surface 576 extends downwardly from the lower flat surface 579 of the left tape track 568 and a similar lower flat surface of the right tape track 570 (not here shown). It can also be seen in drawing FIG. 7 that the entry surface 576 extends outwardly at a second angle 580. The right tape track 570 extends outwardly at a similar angle. The second angle 580 and the left tape track 568 are provided to facilitate an entry of the respective first length of adhesively coated tape material and second length of adhesively coated tape material into their respective left tape track 568 and right tape track 570. The rollers 488 and 490 extend into the recess 564 so they can drivingly engage their respective lengths of adhesively coated tape material.

Figure 13:
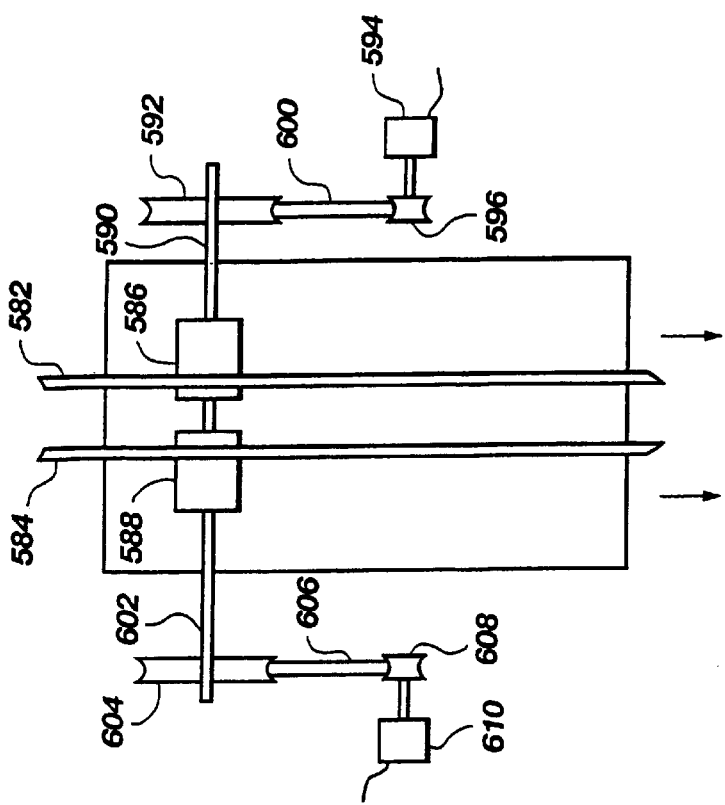

Turning now to drawing FIG. 13, a drive structure similar to that shown in drawing FIGS. 7 through 12 is depicted with a first length 582 and a second length 584 extending over a lower left roller 586 and a lower right roller 588. Notably, the left axle 590 has a pulley associated therewith drivingly interconnected with a stepping motor 594 having a drive pulley 596 associated therewith and with a pulley 600 connected thereinbetween.

Similarly, the right roller 588 is driven by right axle 602 which, in turn, is driven by a driven pulley 604 connected by a belt 606 to a drive pulley 608. The drive pulley is driven by a stepping motor 610.

Figure 14:
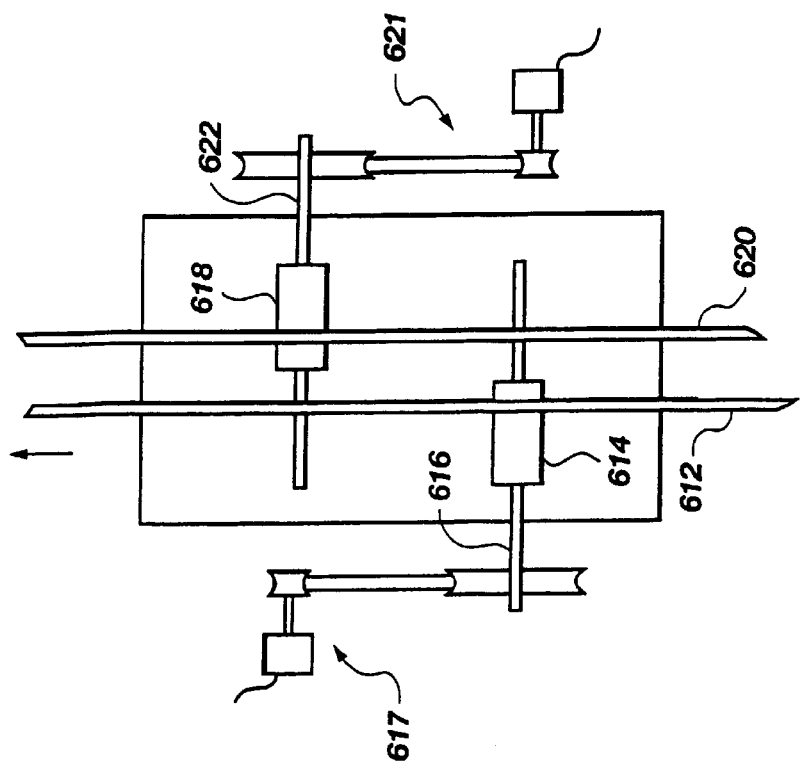
FIGS. 13 and 14 are illustrations of alternate configurations of a drive structure of the present invention.

In drawing FIG. 14, a similar configuration is shown in which a first length 612 is driven by a left pulley 614. The left pulley is connected by a left axle 616 and is driven by a stepping motor and pulley configuration 617 similar to that illustrated and described with respect to FIG. 13. As can be seen, the right pulley 618 is positioned to drive a second length 620. The right pulley 618 is mounted to a right axle 622 and is driven by a pulley and stepping motor arrangement 621 similar to that illustrated and described in drawing FIG. 13. As can be seen in drawing FIG. 14, the left pulley 614 and the right pulley 618 are each spaced apart from each other and mounted to a separate left axle 616 and to a separate right axle 622. Other arrangements may be provided in which a first length and a second length are separately indexed or stepped toward the application structure.

Figure 15:
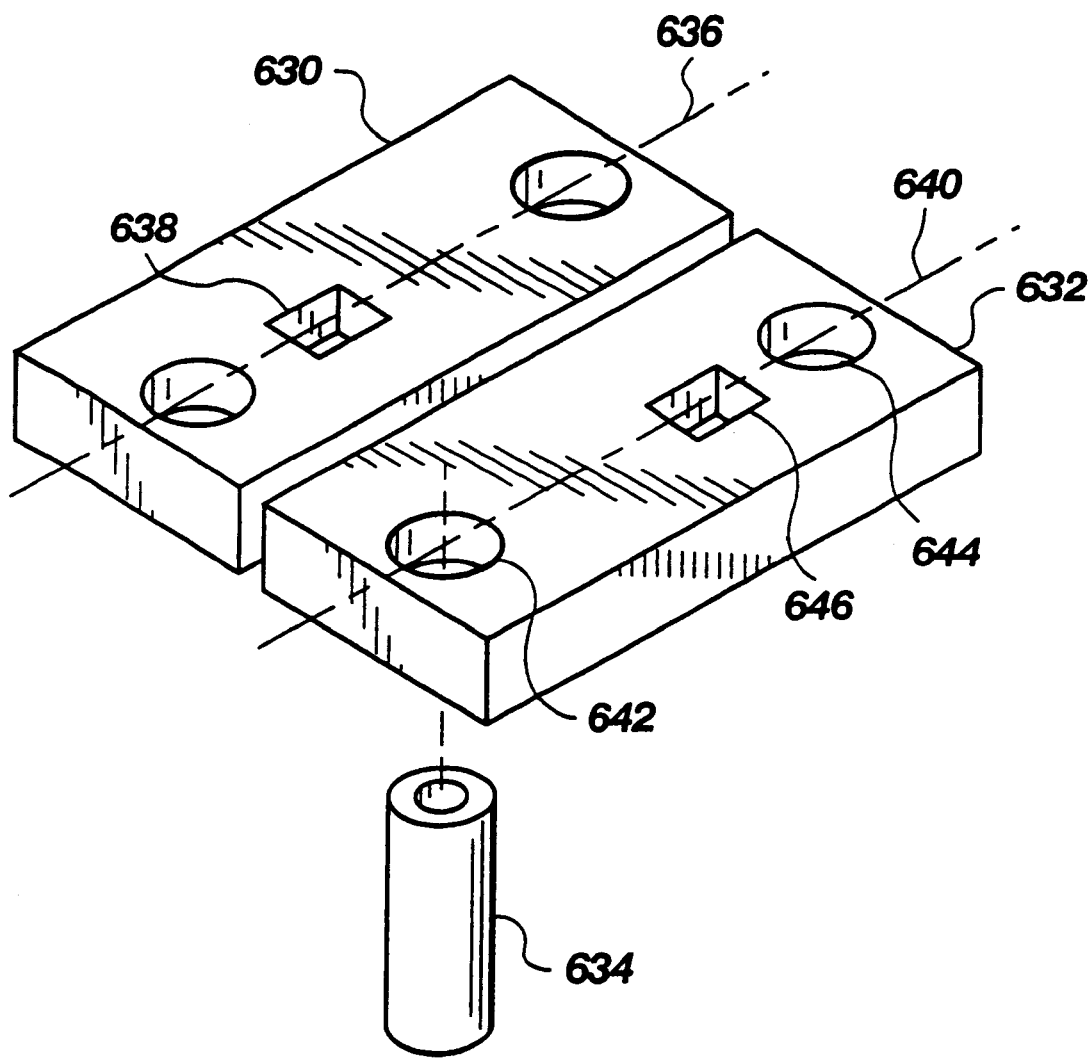
FIGS. 15 and 17 depict portions of an alternate configuration of a drive structure of the present invention in perspective.
Figure 17:
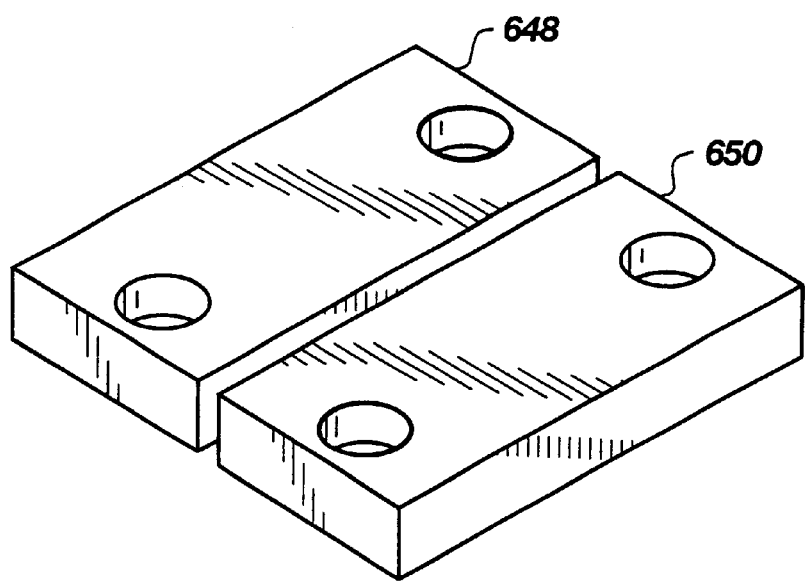

Turning now to drawing FIG. 15, an alternative punch shoe arrangement is shown in which there is a left punch shoe 630 and a right punch shoe 632. Each punch shoe 630 and 632 is mounted to move relative to a similar plurality of bushings such as bushing 634 which functions similar to the bushing illustrated in drawing FIGS. 3 and 4. The left punch shoe 630 has a central axis 636 which, along with punch shoe die aperture 638, is positioned to provide for a sliding relationship relative to a die similar to a left die 316. Similarly, the right punch shoe 632 has a central axis 640 passing through the center of the corresponding apertures 642 and 644 associated with bushings, such as bushing 634, as well as the right punch shoe die aperture 646. In FIG. 17, a left punch plate 648 is shown for positioning relative to a left die, such as left die 316, and a right punch plate 650 is shown for positioning relative to a right die, such as right die 318, as better seen in drawing FIGS. 3 and 4.

Figure 16:
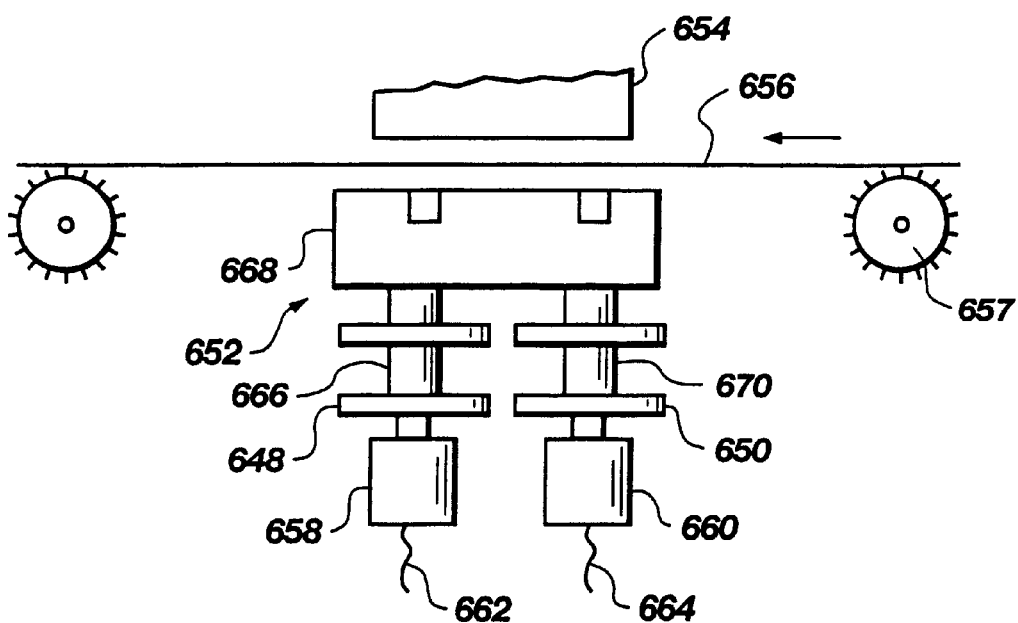
FIG. 16 is a simplified illustration of an alternate configuration of the present invention.

As generally depicted in drawing FIG. 16, an application structure 652 is positioned relative to a block 654 with a plurality of leadframes for semiconductor devices 656 moving relative to the application structure by indexing means such as a roller 657. driven by a stepping motor (not here illustrated). The application structure 652 includes a left punch plate 648 and a right punch plate 650, both positioned to be urged upwardly by respective solenoids 658 and 660, both activated by conductors 662 and 664. As can be seen, solenoid 658 urges the left punch plate 648 upward to, in turn, urge the left die 666 to move upwardly through the base of the application structure 652 to form and advance the first increment or decal upward against the underside of each frame of the plurality of frames 656 upon orientation of a first site relative to the left die 666. Similarly, punch plate 650 may be urged by its solenoid 660 to move upward relative to the plurality of frames 656 to form a second increment from the second length and to urge the second increment toward and attach it to the underside of a second site of a frame positioned relative to the second die 670.

Arrangements, such as that depicted in drawing FIG. 16, may be used with a drive structure in which both the first length and the second length are simultaneously advanced. Some adhesively coated tape material will thereby be wasted because the tape will advance to each die simultaneously with a frame. However, the die will not cut a desired increment until such time as the appropriate first site or second site is presented.

Figure 18:
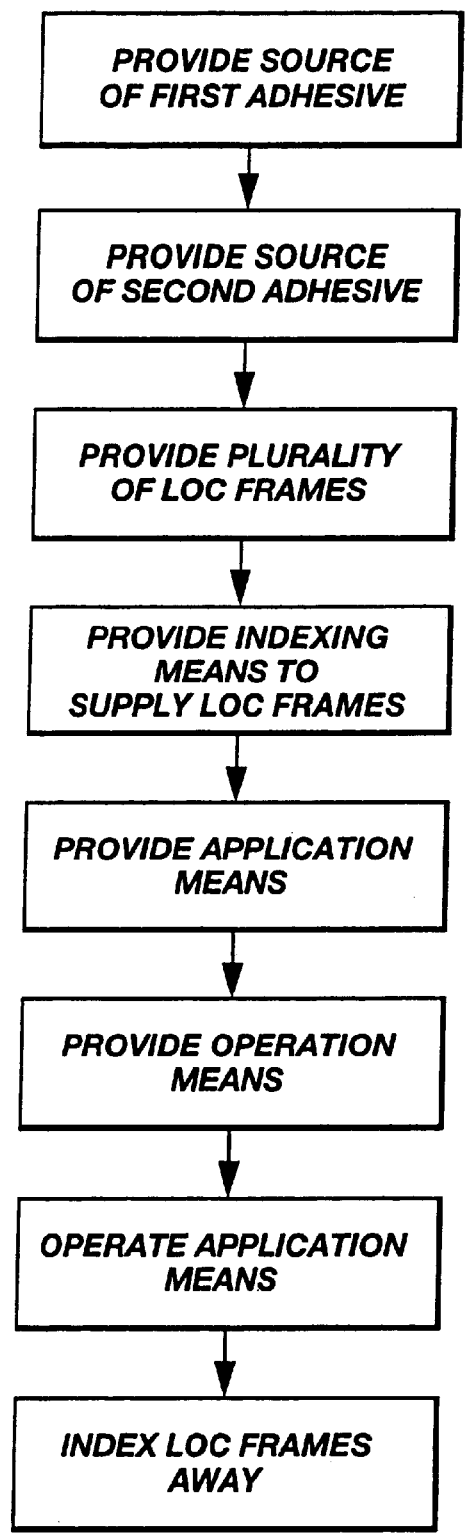
FIG. 18 is a simplified flow diagram of a method of the present invention.

In drawing FIG. 18, a preferred method for operating the illustrated and described apparatus of the present invention is graphically illustrated in a series of steps. More specifically, the preferred method involves an operating structure comparable to that illustrated in drawing FIGS. 3 through 12.

More specifically, it is preferred to separately index or feed the first length to the first die. The controller is activated to urge the first length to advance a distance sufficient to form the first increment and to urge the first die upward to form and urge the first increment at the first site for each and every leadframe of the plurality of leadframes. Similarly, the controller functions to urge the second length toward the second die, the desired length sufficient to form the second increment and only when a second site is presented to or is relative to the second die. Thus, the second die and the first die may move simultaneously, but a first decal and a second decal or first increment and second increment will be formed only when the first length of adhesively coated tape material and the second length of adhesively coated tape material are selectively advanced by the controller. The controller is configured to identify when a first leadframe is being presented and, more particularly, the first site of a first leadframe is being presented to the first die. The controller may also have means to receive information to identify how many leadframes of the plurality of leadframes are in existence and to count those leadframes so that the controller knows when to not advance a first length to form a first increment because a first site is no longer positioned relative to the first die.

Those skilled in the art will recognize that other variations of structures and devices may be provided without deviating from the principles of the invention as herein set forth and as hereinafter defined by the claims.

What is claimed is:

1. An apparatus system for applying adhesively coated material to at least a first portion and a second portion of a semiconductor die mounting site of a first leadframe of a plurality of leadframes for the attachment of a semiconductor devices thereto, said apparatus system comprising:

a first source for supplying a first length of adhesively coated material at a first location of said at least a first portion of said semiconductor die mounting site of said first leadframe of said plurality of leadframes;

a second source for supplying a second length of adhesively coated material at a second location of said at least a second portion of said semiconductor die mounting site of a second leadframe of said plurality of leadframes; and application apparatus configured for receiving said plurality of leadframes in a leadframe-by-leadframe sequence, said application apparatus configured for receiving said first length of adhesively coated material at said first location of said portion of said semiconductor die mounting site of said first leadframe of said plurality of leadframes and for receiving said second length of adhesively coated material at said second location of said portion of said semiconductor die mounting site of said second leadframe of said plurality of leadframes, said application apparatus having cutting apparatus configured for cutting a first increment of said first length of adhesively coated material and for applying said first increment to the first location of said first portion of said semiconductor die mounting site of said first leadframe of said plurality of leadframes when said at least a first leadframe is at said first location and for cutting a second increment of said second length of adhesively coated material and applying said second increment to the second location of said at least a second portion of said semiconductor die mounting site of said second leadframe of said plurality of leadframes after the second leadframe has been subsequently indexed to the second location.

2. The system of claim 1, wherein said cutting apparatus includes:

a first cutting structure located at the first location having a first cutting die, the first cutting structure configured to receive said first length of said adhesively coated material and to receive said first cutting die movable relative to a first cutting structure configured to receive said first length of said adhesively coated material; and operation apparatus positioned to move said first cutting die relative to said first cutting structure to form said first increment and to urge said first increment against said first location of said at least a first portion of said semiconductor die mounting site of said first leadframe of said plurality of leadframes for semiconductor devices.

3. The system of claim 2, wherein said cutting apparatus further includes:

a second die structure located at the second location having a second cutting die, said second die structure configured to receive said second length of said adhesively coated material and configured to receive said second cutting die, the second cutting die movable relative to a second cutting structure configured to receive said second length of said adhesively coated material; and wherein said operation apparatus moves said second cutting die relative to said second cutting structure to form said second increment and to urge said second increment against the second location of said at least a second portion or said semiconductor die mounting site of said second leadframe of said plurality of leadframes for semiconductor devices.

4. The system of claim 3, wherein said first source includes:

a first adhesively coated material supply configured to supply said first length of adhesively coated material.

5. The system of claim 4, wherein said second source includes:

a second adhesively coated material supply configured to supply said second length of adhesively coated material.

6. The system of claim 3, further comprising:

indexing apparatus including:

apparatus configured for moving said plurality of leadframes for semiconductor devices relative to said application apparatus in a single leadframe by single leadframe movement of said plurality of leadframes.

7. The system of claim 6, wherein said application apparatus is configured to receive a plurality of leadframes connected together one to another.

8. The system of claim 7, wherein said application apparatus is configured to receive and position a plurality of leadframes having a removable edge with drive perforations formed therein.

9. The system of claim 8, further comprising a controller in electrical communication with said operation apparatus and adapted for sending and receiving operation signals thereto, and wherein said operation apparatus includes:

a first die moving mechanism positioned relative to said first cutting die for moving said first cutting die toward a leadframe of said plurality of leadframes, said first die moving mechanism being in electrical communication with said controller to receive operation signals therefrom to cause said first die moving mechanism to move said first cutting die toward said leadframe of said plurality of leadframes.

10. The system of claim 9, wherein said first die moving mechanism includes:

a solenoid mechanism positioned to move said first cutting die.

11. The system of claim 3, wherein said application apparatus includes:

a block positioned opposite said first cutting die with said leadframe of said plurality of leadframes positioned between said block and said first cutting die to inhibit movement of said leadframe of said plurality of leadframes upon movement of said first cutting die against said leadframe of said plurality of leadframes.

12. The system of claim 11, wherein said block is sized for positioning opposite both said first cutting die and said second cutting die having a leadframe of said plurality of leadframes positioned between said block and said first cutting die and having a leadframe of said plurality of leadframes positioned between said block and said second cutting die to inhibit movement of said plurality of leadframes upon movement of said first cutting die and said second cutting die against a leadframe of said plurality of leadframes.

13. The system of claim 11, wherein said block includes:

heat apparatus to heat said block, said first increment contacting a leadframe of said plurality of leadframes, and said second increment contacting a leadframe of said plurality of leadframes.

14. The system of claim 3, wherein said application apparatus includes:

a first guide for said first length of adhesively coated material and a second guide for said second length of adhesively coated material.

15. The system of claim 3, wherein said first cutting structure and said second cutting structure are connected.

16. The system of claim 3, wherein said operation apparatus is configured to urge said first cutting die and said second cutting die to move separately and independently.

17. The system of claim 9, wherein said plurality of leadframes includes a first leadframe, a middle leadframe and a last leadframe, and wherein said indexing apparatus is configured to be operable to urge said first leadframe to the first location of said at least a first portion of said semiconductor die mounting site with its first location positioned relative to said semiconductor die mounting site to receive said first increment upon activation of said first source and with its second location positioned to not be contacted by said second cutting die, wherein said controller is in electrical communication with said first source and said second source and is adapted to electrically send operation signals to activate said first source to supply said first length of adhesively coated material to said first cutting structure and to not activate said second source.

18. The system of claim 17, wherein said indexing apparatus is configured to be operable to urge said middle leadframe to have its first location of said at least a first portion of said semiconductor die mounting site positioned relative to said first cutting die to receive said first increment upon activation of said first source and said first cutting die and to thereafter urge said middle leadframe to have its second location of said semiconductor die mounting site positioned relative to said second cutting die to receive said second increment upon activation of said second source and said second cutting die, and wherein said controller is adapted to electrically send operation signals to activate said first source to supply said first length to said first cutting structure and to activate said second source to supply said second length of adhesivelt coated material to said second cutting structure.

19. The system of claim 18, wherein said indexing apparatus is configured to be operable to urge said last leadframe to be positioned with its second location of said semiconductor die mounting site positioned relative to said second cutting die to receive said second increment upon activation of said second source and said second cutting die and with its first location of said semiconductor die mounting site positioned to not be contacted by said first cutting die, and wherein said controller is adapted to electrically send operation signals to activate said second source to supply said second length of adhesively coated material to said second cutting structure and to not activate said first source.

20. The system of claim 19, wherein said indexing apparatus urges said first leadframe and said middle leadframe and said last leadframe to move continuously in sequence.

21. A system for applying adhesively coated material to a portion of a semiconductor die mounting site of a leadframe of a plurality of leadframes for semiconductor devices, said system comprising:

a first source for supplying a first length of adhesively coated material at a first location of said portion of said semiconductor die mounting site of said leadframe of said plurality of leadframes;

a second source for supplying a second length of adhesively coated material at a second location of said portion of said semiconductor die mounting site of said leadframe of said plurality of leadframes;

indexing apparatus for supplying said plurality of leadframes for semiconductor devices in a leadframe-by-leadframe sequence at the first location and the second location of said portion of said semiconductor die mounting site;

application apparatus configured to receive said plurality of leadframes for semiconductor devices in a leadframe-by-leadframe sequence, to receive said first length of adhesively coated material at the first location of said portion of said semiconductor die mounting site and to receive said second length of adhesively coated material at the second location of said portion of said semiconductor die mounting site, said application apparatus having cutting apparatus configured for cutting a first increment of said first length of adhesively coated material and applying said first increment to the first location of said portion of said semiconductor die mounting site of said leadframe of said plurality of leadframes and for cutting a second increment of said second length of adhesively coated material and applying said second increment to the second location of said portion of said semiconductor die mounting site of said leadframe of said plurality of leadframes after the leadframe of said plurality of leadframes has been subsequently indexed to the second location; and control apparatus in electrical communication with said indexing apparatus and configured to supply operation signals thereto to supply said plurality of leadframes for semiconductor devices in leadframe-by-leadframe sequence to said application apparatus to position the first location of said portion of said semiconductor die mounting site and the second location of said portion of said semiconductor die mounting site to receive said first increment and said second increment, respectively, to operate said first source to cause said first length of adhesively coated material to be selectively supplied to said application apparatus when the first location of said portion of said semiconductor die mounting site is positioned to receive said first increment;

to operate said second source to cause said second length of adhesively coated material to be selectively supplied to said application means when the second location of said portion or said semiconductor die mounting site is positioned to receive said second increment; and to operate said cutting apparatus to selectively cut and apply said first increment to the first location of said portion of said semiconductor die mounting site of said leadframe of said plurality of leadframes and to cut and apply said second increment to the second location of said portion of said semiconductor die mounting site of said leadframe of said plurality of leadframes has been indexed to the second location.

22. The system of claim 21, wherein said cutting apparatus includes:

a first cutting structure having a first cutting die located at the first location, the first cutting die movable relative to a first cutting structure configured to receive said first length of adhesively coated material; and operation apparatus positioned to move said first cutting die relative to said first cutting structure to form said first increment and to urge said first increment toward and against the first location of said portion of said semiconductor die mounting site of said leadframe of said plurality of leadframes for semiconductor devices.

23. The system of claim 22, wherein said cutting apparatus further includes:

a second cutting structure having a second die located at the second location, the second cutting die movable relative to a second cutting structure configured to receive said second length of said adhesively coated material; and wherein said operation apparatus is positioned to move said second die relative to said second cutting structure to form said second increment and to urge said second increment towards and against said second location of said portion of said semiconductor die mounting site of said leadframe of said plurality of leadframes for semiconductor devices.

24. The system of claim 23, wherein said first source includes:

a first adhesively coated material supply configured to supply said first length of adhesively coated material.

25. The system of claim 24, wherein said second source includes:

a second adhesively coated material supply configured to supply said second length of adhesively coated material.

26. The system of claim 25, wherein said indexing apparatus includes:

apparatus configured to urge said plurality of leadframes for semiconductor devices to move relative to said application apparatus.

27. The system of claim 26, wherein said application apparatus is configured to receive a plurality of leadframes connected together one to another.

28. The system of claim 27, wherein said application apparatus is configured to receive and position a plurality of leadframes having a removable edge with drive perforations formed therein.

29. The system of claim 28, wherein said operation apparatus includes:

a first die moving mechanism positioned relative to said first cutting die for urging said first cutting die to move toward a leadframe of said plurality of leadframes, said first die moving mechanism being connected to said control apparatus to receive operation signals therefrom to cause said first die moving mechanism to move said first cutting die toward said leadframe of said plurality of leadframes.

30. The system of claim 29, wherein said first die moving mechanism includes:

a solenoid mechanism positioned to urge said first cutting die to move.

31. The system of claim 30, wherein said application apparatus includes:

a block positioned opposite said first cutting die with said leadframe of said plurality of leadframes positioned between said block and said first cutting die to inhibit movement of said leadframe of said plurality of leadframes upon movement of said first cutting die against said leadframe of said plurality of leadframes.

32. The system of claim 31, wherein said block is sized for positioning opposite both said first cutting die and said second cutting die having a leadframe of said plurality of leadframes positioned between said block and said first cutting die and having a leadframe of said plurality of leadframes positioned between said block and said second die to inhibit movement of said plurality of leadframes upon movement of said first cutting die and said second cutting die against said leadframe of said plurality of leadframes.

33. The system of claim 31, wherein said block includes:
heat apparatus to heat said block, said first increment, and said second increment upon urging of same against a leadframe of said plurality of leadframes.

34. The system of claim 23, wherein said application apparatus includes:
a first guide for said first length of adhesively coated material and a second guide for said second length of adhesively coated material.

35. The system of claim 23, wherein said first cutting structure and said second cutting structure are connected.

36. The system of claim 23, wherein said operation apparatus is configured to urge said first cutting die and said second cutting die to move separately and independently.

37. The system of claim 32, wherein said application apparatus is configured to receive a plurality of leadframes including a first leadframe, a middle leadframe and a last leadframe, and wherein said indexing apparatus is configured to be operable to urge said first leadframe to a first position with the first location of said portion of said semiconductor die mounting site positioned relative to said first cutting die to receive said first increment upon activation of said first source and having the second location of said portion of said semiconductor die mounting site positioned spaced to not be contacted by said second cutting die, wherein said control apparatus is in electrical communication with said first source and said second source and is adapted to electrically send operation signals to activate said first source to supply said first length of adhesively coated material to said first cutting structure and to not activate said second source.

38. The system of claim 37, wherein said indexing apparatus is configured to be operable to urge said middle leadframe to have its first location of said portion of said semiconductor die mounting site positioned relative to said first cutting die to receive said first increment upon activation of said first source and said first cutting die and to thereafter urge said middle leadframe to have its second location of said portion of said semiconductor die mounting site positioned relative to said second cutting die to receive said second increment upon activation of said second source and said second cutting die, and wherein said control apparatus is adapted to electrically send operation signals to activate said first source to supply said first length of adhesively coated material to said first cutting structure and to activate said second source to supply said second length to said second cutting structure.

39. The system of claim 38, wherein said indexing apparatus is configured to be operable to urge said last leadframe to be positioned with its second location of said portion of said semiconductor die mounting site positioned relative to said second cutting die to receive said second increment upon activation of said second source and said second cutting die and with is first location of said portion of said semiconductor die mounting site positioned to not be contacted by said first cutting die, and wherein said control apparatus is adapted to electrically send operation signals to activate said second source to supply said second length of adhesively coated material to said second cutting structure and to not activate said first source.

40. The system of claim 39, wherein said indexing apparatus urges said first leadframe and said middle leadframe and said last leadframe to move continuously in sequence.

41. Apparatus for application of adhesive tape to a semiconductor die mounting site of a LOC leadframe of a plurality of LOC leadframes, said apparatus comprising:
a base;
a block positioned proximate said base and spaced therefrom for said LOC leadframe to pass closely and freely therebetween;
supply apparatus positioned relative to said base to supply a first tape length at a first location of said semiconductor die mounting site of said LOC leadframe and a second tape length at a second location of said semiconductor die mounting site of said LOC leadframe to said base;
indexing apparatus for moving each LOC leadframe of said plurality of LOC leadframes relative to said base from the first location of said semiconductor die mounting site to the second location of said semiconductor die mounting site;
application apparatus mechanically associated with said base for cutting said first tape length into a first tape decal and applying said first tape decal to the first location of said semiconductor die mounting site of an LOC leadframe positioned between said base and said block at the first location and for cutting said second tape length into a second tape decal and applying said second tape decal to the second location of said semiconductor die mounting site on a LOC leadframe positioned between said base and said block at the second location after the leadframe has been subsequently indexed to the second location, said application apparatus including a plurality of physically independent and mutually uncoupled cutting dies adapted for cutting said first and second tape lengths into said first and second tape decals; and control apparatus in electrical communication with said application apparatus and configured to send operational signals thereto for causing said application apparatus to cut said first tape length into said first tape decal and for applying said first tape decal to said first location of said semiconductor die mounting site on said LOC leadframe and to cut said second tape length into said second tape decal and for applying said second tape decal to a second location of said semiconductor die mounting site on said LOC leadframe positioned between said base and said block at the second location.

42. The apparatus of claim 41, wherein said application apparatus includes a first cutting die positioned to cut said first tape length to form said first tape decal and to urge said first tape decal to said first location of said semiconductor die mounting site, and wherein said block is positioned relative to said first cutting die to inhibit movement of said LOC leadframe of said plurality of LOC leadframes upon movement of said first die against said LOC leadframe of said plurality of LOC leadframes.

43. The system of claim 42, wherein said application means includes a second cutting die positioned to cut said second tape length to form said second tape decal and to urge said second tape decal to the second location of said semiconductor die mounting site, and wherein said block is sized for positioning opposite both said first cutting die and said second cutting die with a LOC leadframe of said plurality of LOC leadframes positioned between said block and said first cutting die and with another LOC leadframe of said plurality of LOC leadframes positioned between said block and said second cutting die to inhibit movement of said another LOC leadframe of said plurality of leadframes upon movement of said first cutting die and said second cutting die against said LOC leadframe of said plurality of LOC leadframes.

44. The system of claim 43, wherein said block includes:
heat means to heat said block and said LOC leadframe and said another LOC leadframe and said first increment and said second increment upon urging of same against said LOC leadframe.

45. The system of claim 44, wherein said application apparatus includes:

a first guide for said first tape length; and a second guide for said second tape length.

46. The system of claim 45, wherein said indexing apparatus includes structure configured to urge said plurality of LOC leadframes to move relative to said application apparatus.

47. The system of claim 46, wherein said application apparatus includes:

a first die moving mechanism positioned relative to said first die for urging said first cutting die to move toward said LOC leadframe of said plurality of LOC leadframes, said first die moving mechanism being electrically connected to said control apparatus to receive operation signals therefrom to cause said first die moving mechanism to move said first cutting die toward said LOC leadframe of said plurality of LOC leadframes.

48. The system of claim 47, wherein said first die moving mechanism includes a solenoid mechanism positioned to urge said first cutting die to move.

* * * * *

UNITED STATES PATENT AND TRADEMARK OFFICE
CERTIFICATE OF CORRECTION

| | | |
|---|---|---|
| PATENT NO. | : 6,267,167 B1 | Page 1 of 5 |
| APPLICATION NO. | : 09/330794 | |
| DATED | : July 31, 2001 | |
| INVENTOR(S) | : Gregory M. Chapman | |

It is certified that error appears in the above-identified patent and that said Letters Patent is hereby corrected as shown below:

In the drawings:

In FIG. 1, delete lowermost second occurrence of reference numeral "98" and associated lead line extending from controller 32

In FIG. 3, in the uppermost central portion of drawing add reference numeral --276-- to lead line missing a numeral, located directly left of reference numeral "278"; complete missing uppermost corner of guide insert "276"; extend lead line from aperture left of aperture 289, located on guide insert 276 and add reference numeral --288-- to end of extended lead line; extend middle lead line on left portion of guide insert "276" and add reference numeral --280-- to that extended lead line; create right side width line parallel with left side width line of left portion of guide insert "276"; add right directional arrow line extending from middle of right side of "280" lead line to end at right side width line
change lowermost second occurrence of reference numeral "260" located below reference numeral 290, to --261--
change first occurrence of reference numeral "341" located below guide post 296, to --340--

In FIG. 4, change reference numeral "340" to --340'--

In FIG. 12, add reference numeral --568-- and associated lead line

UNITED STATES PATENT AND TRADEMARK OFFICE
CERTIFICATE OF CORRECTION

| | |
|---|---|
| PATENT NO. | : 6,267,167 B1 |
| APPLICATION NO. | : 09/330794 |
| DATED | : July 31, 2001 |
| INVENTOR(S) | : Gregory M. Chapman |

It is certified that error appears in the above-identified patent and that said Letters Patent is hereby corrected as shown below:

In FIG. 14, move existing reference numeral "618" and associated lead line to far right upper side of drawing, with lead line for --618-- extending from portion adjacent to 622; move existing reference numeral "614" and associated lead line to far lower left side of drawing, with lead line for --614-- extending from portion adjacent to 616

In FIG. 16, delete reference numeral "668" and associated lead line

In the specification:

| | | |
|---|---|---|
| COLUMN 1, | LINE 9, | after "165." change the period to a comma and insert --issued Aug. 1, 2000.-- |
| COLUMN 1, | LINE 43, | change "Alternately," to --Alternatively,-- |
| COLUMN 1, | LINE 51, | change "an" to --a-- |
| COLUMN 4, | LINE 17, | change "said" to --the-- |
| COLUMN 5, | LINE 21, | change "Alternately," to --Alternatively,-- |
| COLUMN 5, | LINE 24, | change "alternate" to --alternative-- |
| COLUMN 5, | LINE 63, | change "alternate" to --alternative-- |
| COLUMN 6, | LINE 14, | change "an" to --a-- |
| COLUMN 6, | LINE 15, | change "an" to --a-- |
| COLUMN 6, | LINE 43, | change "alternate" to --alternative-- |
| COLUMN 6, | LINE 59, | change "alternate" to --alternative-- |
| COLUMN 6, | LINE 61, | change "alternate" to --alternative-- |
| COLUMN 6, | LINE 64, | change "alternate" to --alternative-- |
| COLUMN 8, | LINE 8, | after "second" and before "supply" insert --adhesive-- |
| COLUMN 8, | LINE 32, | change "Alternately," to --Alternatively,-- |
| COLUMN 8, | LINE 48, | change "perforations 82" to --indexing holes 82-- |
| COLUMN 8, | LINE 60, | at the end of the line delete "90" |
| COLUMN 8, | LINE 61, | after "die site" insert --90-- |
| COLUMN 8, | LINE 67, | at the end of the line delete "96" |

UNITED STATES PATENT AND TRADEMARK OFFICE
CERTIFICATE OF CORRECTION

PATENT NO. : 6,267,167 B1
APPLICATION NO. : 09/330794
DATED : July 31, 2001
INVENTOR(S) : Gregory M. Chapman It is certified that error appears in the above-identified patent and that said Letters Patent is hereby corrected as shown below:

| | | |
|---|---|---|
| COLUMN 9, | LINE 1, | after "die site" insert --96-- |
| COLUMN 9, | LINE 2, | after "first portion" delete "90" and after "die site" insert --90-- |
| COLUMN 9, | LINE 7, | after "first portion" delete "90" and after "die site" insert --90-- |
| COLUMN 9, | LINE 9, | after "second portion" delete "96" |
| COLUMN 9, | LINE 10, | after "die site" insert --96-- |
| COLUMN 9, | LINE 13, | after "second portion" delete "96" and after "die site" insert --96-- |
| COLUMN 9, | LINE 16, | after "first portion" delete "90" and after "die site" insert --90-- |
| COLUMN 9, | LINE 23, | after "first portion" delete "90" and after "die site" insert --90-- |
| COLUMN 9, | LINE 24, | after "first die aperture" insert --92-- |
| COLUMN 9, | LINE 41, | change "structure," to --structure-- |
| COLUMN 10, | LINE 2, | change "material 106" to --adhesively coated tape material 106-- |
| COLUMN 10, | LINE 13, | after "first drive roller" insert --122-- and delete "(not shown)" |
| COLUMN 10, | LINE 17, | change "second drive roller 122" to --first drive roller 122-- |
| COLUMN 10, | LINE 66, | after "rear cross member" insert --168-- |
| COLUMN 12, | LINE 5 | change "right flat surface 206" to --lower right flat surface 206-- |
| COLUMN 12, | LINE 7, | after the first occurrence of "guide" insert --200-- and after "right tape guide" insert --203-- |
| COLUMN 13, | LINE 5, | change "posts 294-297" to --guide posts 294-297-- |
| COLUMN 13, | LINE 8, | change "posts 294-297" to --guide posts 294-297-- |
| COLUMN 13, | LINE 13, | change "die aperture 324" to --left die aperture 324-- |
| COLUMN 13, | LINE 46, | change "length 340" to --length 340'-- |
| COLUMN 13, | LINE 60, | change "340" to --340'-- |
| COLUMN 13, | LINE 62, | change "340" to --340'-- |
| COLUMN 14, | LINE 4, | change "dies" to --dice-- |

UNITED STATES PATENT AND TRADEMARK OFFICE
CERTIFICATE OF CORRECTION

PATENT NO. : 6,267,167 B1
APPLICATION NO. : 09/330794
DATED : July 31, 2001
INVENTOR(S) : Gregory M. Chapman It is certified that error appears in the above-identified patent and that said Letters Patent is hereby corrected as shown below:

| | | |
|---|---|---|
| COLUMN 14, | LINE 23, | change "recess portion 260" to --receiving recess 261-- |
| COLUMN 14, | LINE 24, | after "276." insert --(FIG. 3).-- |
| COLUMN 14, | LINE 46, | change "over upper" to --over the upper-- |
| COLUMN 14, | LINE 60, | change "Dies" to --Dice-- |
| COLUMN 14, | LINE 61, | change "respectively, the" to --respectively, being the-- |
| COLUMN 15, | LINE 35, | change "length 444" to --distance 444-- |
| COLUMN 15, | LINE 48, | after "top" insert --424-- |
| COLUMN 15, | LINE 49, | change "first die 424" to --first die,-- |
| COLUMN 16, | LINE 16, | change "dies" to --dice-- |
| COLUMN 17, | LINE 22, | change "roller 522" to --upper roller 522-- and change "left roller 524" to --left upper roller 524-- |
| COLUMN 17, | LINE 28, | after "guide" insert --558-- |
| COLUMN 17, | LINE 31, | change "upper right roller" to --right upper roller-- and change "upper left roller" to --left upper roller-- |
| COLUMN 17, | LINE 32, | after "aperture" insert --562-- |
| COLUMN 17, | LINE 36, | change "left lower roller" to --lower left roller-- and change "right lower roller" to --lower right roller-- |
| COLUMN 17, | LINE 50, | before "left roller" insert --lower-- and before "right roller" insert --lower-- |
| COLUMN 17, | LINE 56, | change "upper right roller" to --right upper roller-- and change "right lower" to --lower right-- |
| COLUMN 17, | LINE 57, | change "left lower roller" to --lower left roller-- |
| COLUMN 17, | LINE 66, | at the beginning of the line before "left roller" insert --lower-- |
| COLUMN 18, | LINE 33, | after "pulley" insert --592-- |
| COLUMN 18, | LINE 35, | change "pulley" to --belt-- |
| COLUMN 18, | LINE 43, | after "left pulley" insert --614-- |

UNITED STATES PATENT AND TRADEMARK OFFICE
CERTIFICATE OF CORRECTION

PATENT NO. : 6,267,167 B1
APPLICATION NO. : 09/330794
DATED : July 31, 2001
INVENTOR(S) : Gregory M. Chapman It is certified that error appears in the above-identified patent and that said Letters Patent is hereby corrected as shown below:

| | | |
|---|---|---|
| COLUMN 18, | LINE 62, | change "bushing" to --bushings-- |
| COLUMN 19, | LINE 11, | change "roller 657, driven" to --roller 657 driven-- |
| COLUMN 19, | LINE 20, | change "frames 656" to --frames for semiconductor devices 656-- |
| COLUMN 19, | LINE 23, | change "frames 656" to --frames for semiconductor devices 656-- |

Signed and Sealed this

Twenty-fifth Day of March, 2008

JON W. DUDAS
*Director of the United States Patent and Trademark Office*